(12) United States Patent
Ahn et al.

(10) Patent No.: US 10,533,253 B2
(45) Date of Patent: Jan. 14, 2020

(54) FLUID PERMEABLE ANODIC OXIDE FILM AND FLUID PERMEABLE BODY USING ANODIC OXIDE FILM

(71) Applicant: Point Engineering Co., Ltd., Asan-si, Chungcheongnam-do (KR)

(72) Inventors: Bum Mo Ahn, Suwon-si (KR); Seung Ho Park, Hwaseong-si (KR); Sung Hyun Byun, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 81 days.

(21) Appl. No.: 15/369,042

(22) Filed: Dec. 5, 2016

(65) Prior Publication Data
US 2017/0167025 A1 Jun. 15, 2017

(30) Foreign Application Priority Data

Dec. 9, 2015 (KR) .................. 10-2015-0175181
Dec. 9, 2015 (KR) .................. 10-2015-0175202
Dec. 9, 2015 (KR) .................. 10-2015-0175204

(51) Int. Cl.
*C23C 16/455* (2006.01)
*C25D 11/24* (2006.01)
(Continued)

(52) U.S. Cl.
CPC ...... *C23C 16/45565* (2013.01); *B01D 67/003* (2013.01); *B01D 67/0062* (2013.01);
(Continued)

(58) Field of Classification Search
CPC .............. B01D 2325/02; B01D 67/003; B01D 67/0062; B01D 67/0065; B01D 69/06; B01D 71/022; B01D 71/025; C23C 16/4404; C23C 16/45565; C25D 11/04; C25D 11/24; H01J 37/3244
See application file for complete search history.

(56) References Cited

U.S. PATENT DOCUMENTS 5,259,957 A 11/1993 Rosenfeld et al. ............ 210/490
6,474,570 B2 * 11/2002 Chen .................... C23C 16/455
239/390

(Continued)

FOREIGN PATENT DOCUMENTS

JP 2007-014892 A 1/2007 ............. B01D 69/10
KR 10-0653442 11/2006 ........... H01L 21/205

OTHER PUBLICATIONS

Hwang et al., "Fabrication of Highly Ordered Pore Array in Anodic Aluminum Oxide", Korean Journal of Chemical Engineering, vol. 19, No. 3, 7 pp. 467-473, May 1, 2002.
(Continued)

*Primary Examiner* — Dirk R Bass
(74) *Attorney, Agent, or Firm* — Sunstein Kann Murphy & Timbers LLP

(57) ABSTRACT

A fluid permeable anodic oxide film includes a plurality of regularly-disposed pores formed by anodizing metal and a plurality of permeation holes having an inner width larger than an inner width of the pores and extending through the fluid permeable anodic oxide film. Also provided is a fluid permeable body which makes use of the fluid permeable anodic oxide film.

9 Claims, 23 Drawing Sheets

(51) Int. Cl.
  *B01D 67/00* (2006.01)
  *C25D 11/04* (2006.01)
  *C23C 16/44* (2006.01)
  *B01D 71/02* (2006.01)
  *H01J 37/32* (2006.01)
  *B01D 69/06* (2006.01)

(52) U.S. Cl.
  CPC ....... *B01D 67/0065* (2013.01); *B01D 71/022* (2013.01); *B01D 71/025* (2013.01); *C23C 16/4404* (2013.01); *C25D 11/04* (2013.01); *C25D 11/24* (2013.01); *H01J 37/3244* (2013.01); *B01D 69/06* (2013.01); *B01D 2325/02* (2013.01)

(56) References Cited

U.S. PATENT DOCUMENTS

| | | | |
|---|---|---|---|
| 8,210,360 B2 | 7/2012 | Routkevitch et al. | 210/490 |
| 2003/0010446 A1 | 1/2003 | Kajiyama et al. | 156/345.1 |
| 2005/0188617 A1 | 9/2005 | Ogura et al. | 48/127.9 |
| 2006/0060138 A1 | 3/2006 | Keller et al. | |
| 2007/0052355 A1* | 3/2007 | Zimmermann | H01J 37/3244 313/512 |
| 2007/0190302 A1 | 8/2007 | Maeda et al. | 428/304.4 |
| 2007/0235137 A1 | 10/2007 | Tsukamoto et al. | 156/345.35 |
| 2012/0186985 A1 | 7/2012 | Mitsuhashi et al. | 205/204 |

OTHER PUBLICATIONS

Li et al., "On the Growth of Highly Ordered Pores in Anodized Aluminum Oxide", Chemistry of Materials, vol. 10, No. 9 pp. 2470-2480, dated Sep. 1, 1998.

Thompson, "Porous anodic alumina: fabrication, characterization and applications", Thin Solid Films, Elsevier, vol. 291, No. 1-2, pp. 192-201, Apr. 1, 1997.

European Patent Office, Extended European Search Report—Application No. 16201922.8-1370, dated Mar. 23, 2017, 14 pages.

European Patent Office, Office Action—European Application No. 16201922.8-1104, dated May 9, 2018, 8 pages.

* cited by examiner

FLUID PERMEABLE ANODIC OXIDE FILM AND FLUID PERMEABLE BODY USING ANODIC OXIDE FILM

CROSS-REFERENCE TO RELATED PATENT APPLICATION

This U.S. non-provisional patent application claims priority under 35 U.S.C. § 119 of Korean Patent Application No. 10-2015-0175202, 10-2015-0175181, 10-2015-0175204 filed on Dec. 9, 2015 in the Korean Patent Office, the entire contents of which are hereby incorporated by reference.

TECHNICAL FIELD

The present invention relates to a fluid permeable anodic oxide film having permeation holes, and a fluid permeable body using an anodic oxide film.

BACKGROUND

In general, a fluid permeable film is used for the purpose of separation, purification, filtering, analysis, reaction, diffusion or the like of a fluid (a gas or a liquid). In particular, an anodic oxide film is available as a fluid permeable film which can be manufactured at a low cost and which has a plurality of pores.

The anodic oxide film, which is formed by anodizing a base metal, includes a porous layer having a plurality of pores formed on the surface thereof. The base metal referred to herein may be aluminum (Al), titanium (Ti), tungsten (W), zinc (Zn) or the like. However, aluminum or aluminum alloy, which is lightweight, easy to process, superior in heat conductivity and free from contamination of heavy metal, is widely used as the base metal.

As shown in FIG. 1, a fluid permeable anodic oxide film of prior art manufactured by anodizing metal is disclosed in U.S. Pat. No. 8,210,360.

In the anodic oxide film of prior art, the inner width of pores formed in the anodic oxide film falls within a range of about several nanometers to 300 nanometers. Since the inner width of pores is too small, the pores are easily clogged by extraneous materials contained in a fluid permeating through the anodic oxide film. This poses a problem in that the fluid is unable to easily permeate through the anodic oxide film.

In order to ameliorate the problem caused by the small diameter of the pores of the anodic oxide film, it is conceivable to use a method of enlarging the pores of the anodic oxide film. However, since the inner width of the pores is in an order of nanometers, it is difficult to enlarge the pores. In addition, there is a drawback in that the structural strength of the anodic oxide film is significantly reduced by the enlargement of the pores.

A fluid passing member, through which a fluid (a gas or a liquid) can pass, is used for the purpose of diffusion, separation, purification, filtering, analysis, reaction or the like of a fluid.

In general, a plurality of through-holes is formed in the fluid passing member so that a fluid can pass through the through-holes. In order for a fluid to be uniformly diffused after passing through the fluid passing member, it is preferred that the number of the through-holes is increased while reducing the inner width of the through-holes. However, difficulties are involved in reducing the inner width of the through-hole.

As an example of the fluid passing member mentioned above, there is available a diffuser (shower head) for uniformly injecting a gas toward a glass accommodated within a vacuum chamber for the manufacture of a liquid crystal display (LCD). The liquid crystal display (LCD) is a non-light-emitting element formed by filling a liquid crystal between an array substrate and a color filter substrate and configured to obtain an image effect using the characteristics of the liquid crystal. Each of the array substrate and the color filter substrate is manufactured by a process of repeatedly depositing a film on a transparent glass made of glass or the like and a process of patterning and etching the film thus deposited. When the deposition process is performed by introducing a reactant and a source material into the vacuum chamber in a gaseous state, the gas thus introduced passes through a diffuser (shower head) and is deposited on a glass mounted on an upper surface of a susceptor, thereby forming a film.

A diffuser (shower head) of prior art, which is a fluid passing member, is disclosed in Korean Patent Registration No. 0653442.

As illustrated in FIG. 8, a reaction gas introduced through an introduction part 18 passes (permeates) through a diffuser 15. The reaction gas is injected toward a glass mounted on a susceptor S.

However, there is a problem in that it is impossible to uniformly inject the reaction gas toward the glass through the holes formed in the diffuser of prior art. In order to ameliorate this problem, it is conceivable to reduce the inner width of the holes and to increase the number of holes. However, there is a limit in manufacturing the diffuser of prior art.

SUMMARY

In view of the problems mentioned above, it is an object of the present invention to provide a fluid permeable anodic oxide film capable of enabling permeation and uniform diffusion of a fluid, maintaining structural strength and facilitating the manufacture thereof, and a fluid permeable body using an anodic oxide film capable of improving the diffusion uniformity of a fluid.

According to one aspect of the present invention, there is provided a fluid permeable anodic oxide film, including: a plurality of regularly-disposed pores formed by anodizing metal; and a plurality of permeation holes having an inner width larger than an inner width of the pores and extending through the fluid permeable anodic oxide film.

The inner width of the permeation holes may remain constant from one end of the fluid permeable anodic oxide film to the other end of the fluid permeable anodic oxide film.

The pores may be positioned between the permeation holes.

According to another aspect of the present invention, there is provided a fluid permeable body, including: a fluid passing member having a through-hole through which a fluid passes; and a fluid permeable anodic oxide film coupled to the fluid passing member, wherein the fluid permeable anodic oxide film includes a plurality of regularly-disposed pores formed by anodizing metal and a plurality of permeation holes having an inner width larger than an inner width of the pores and extending through the fluid permeable anodic oxide film, the through-hole communicating with the permeation holes.

The fluid passing member may include at least two fluid passing members coupled to one another, and the fluid permeable anodic oxide film may be disposed between the two fluid passing members and coupled to a surface of at least one of the two fluid passing members.

The fluid passing member may include a seating portion having a seating groove formed on an upper surface of the fluid passing member, and the fluid permeable anodic oxide film may be seated on the seating portion.

A first metal portion may be formed in an outer periphery portion of the fluid permeable anodic oxide film and may be coupled to the fluid passing member.

The fluid permeable anodic oxide film may be formed by anodizing a base metal and then removing the base metal.

The fluid permeable body may further include: a metal portion formed on an upper surface or a lower surface of the fluid permeable anodic oxide film.

The fluid passing member may be a diffuser installed within a vacuum chamber.

According to a further aspect of the present invention, there is provided a fluid permeable body, including: a main body having a through-hole through which a fluid passes; and an anodic oxide film integrally formed with at least one surface of the main body, wherein the anodic oxide film has permeation holes communicating with the through-hole.

An inner width of the through-hole on one surface on which the anodic oxide film is formed may be larger than an inner width of the permeation holes, and the permeation holes may communicate with the through-hole within an extent of the inner width of the through-hole.

The through-hole may include a first through-hole and a second through-hole having an inner width smaller than an inner width of the first through-hole, and the permeation holes may be positioned below the second through-hole.

The through-hole may be defined by an inner wall which is obliquely formed so that an inner width thereof grows smaller toward the permeation holes.

The anodic oxide film may include a first anodic oxide film and a second anodic oxide film, and the main body may be positioned between the first anodic oxide film and the second anodic oxide film.

According to the present invention, the following effects may be achieved.

A fluid can pass through the permeation holes of the fluid permeable anodic oxide film without clogging the permeation holes and can be uniformly disposed. Thus, the diffusion uniformity of the fluid is improved. Furthermore, the structural strength of the fluid permeable anodic oxide film can be maintained and the fluid permeable anodic oxide film can be manufactured with ease. Furthermore, the fluid permeable anodic oxide film makes it possible to check the amount of an impurity caught in the permeation holes. Furthermore, the fluid permeable anodic oxide film is pliable and, therefore, can be bent in a fluid flow direction when a fluid passes through the film. Thus, the diffusion width of a fluid is increased. Furthermore, the fluid permeable anodic oxide film can be manufactured by combining it with an existing fluid passing member. Thus, the manufacturing process thereof is simple and easy. Furthermore, the permeation holes can be formed so as to maintain the structural strength of the fluid permeable anodic oxide film. In addition, the use of the anodic oxide film formed by anodizing a main body makes it possible to simply and easily perform the manufacturing process.

DETAILED DESCRIPTION

Figure 1:
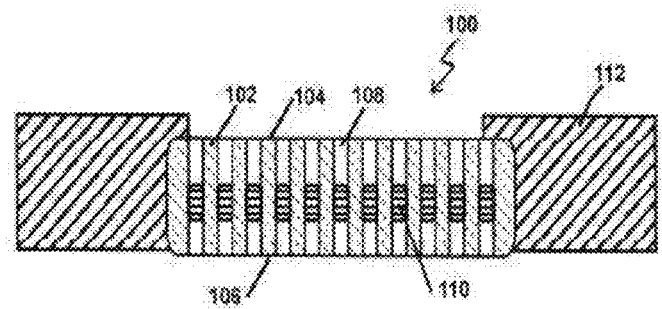
FIG. 1 is a sectional view showing a fluid permeable anodic oxide film of prior art.

Preferred embodiments of the present invention will now be described in detail with reference to the accompanying drawings. The advantages, features and methods for achieving the same will become apparent from the following description of preferred embodiments given in conjunction with the accompanying drawings. However, the present invention is not limited to the embodiments described herein but may be embodied in many different forms. Rather, the embodiments disclosed herein are provided in order to ensure that the disclosure becomes thorough and perfect and to ensure that the concept of the present invention is sufficiently delivered to a person having an ordinary knowledge in the relevant art. The present invention is defined only by the claims. Throughout the specification, the same reference symbols designate like components.

The terms used herein are presented for the description of the embodiments but are not intended to limit the present invention. In the subject specification, a singular form includes a plural form unless specifically mentioned otherwise. By the term "comprises" or "comprising" used herein, it is meant that a component, a step, an operation or an element referred to herein does not exclude existence or addition of one or more other components, steps, operations or elements. Furthermore, the reference symbols presented in the order of descriptions is not necessarily limited to the specified order.

The embodiments disclosed herein will be described with reference to sectional views and/or plane views which are ideal exemplary views illustrating the present invention. In the drawings, the thickness of a film and a region is exaggerated to effectively describe the technical contents. Thus, the form of exemplary views may be changed depending on a manufacturing technique and/or a tolerance. For that reason, the embodiments of the present invention are not limited to specific formed illustrated in the drawings but may include changes in form generated depending on a manufacturing process. Accordingly, the regions illustrated in the drawings have general attributes. The shapes of the regions illustrated in the drawings merely illustrate specific forms of element regions and do not limit the scope of the invention.

Figure 29:
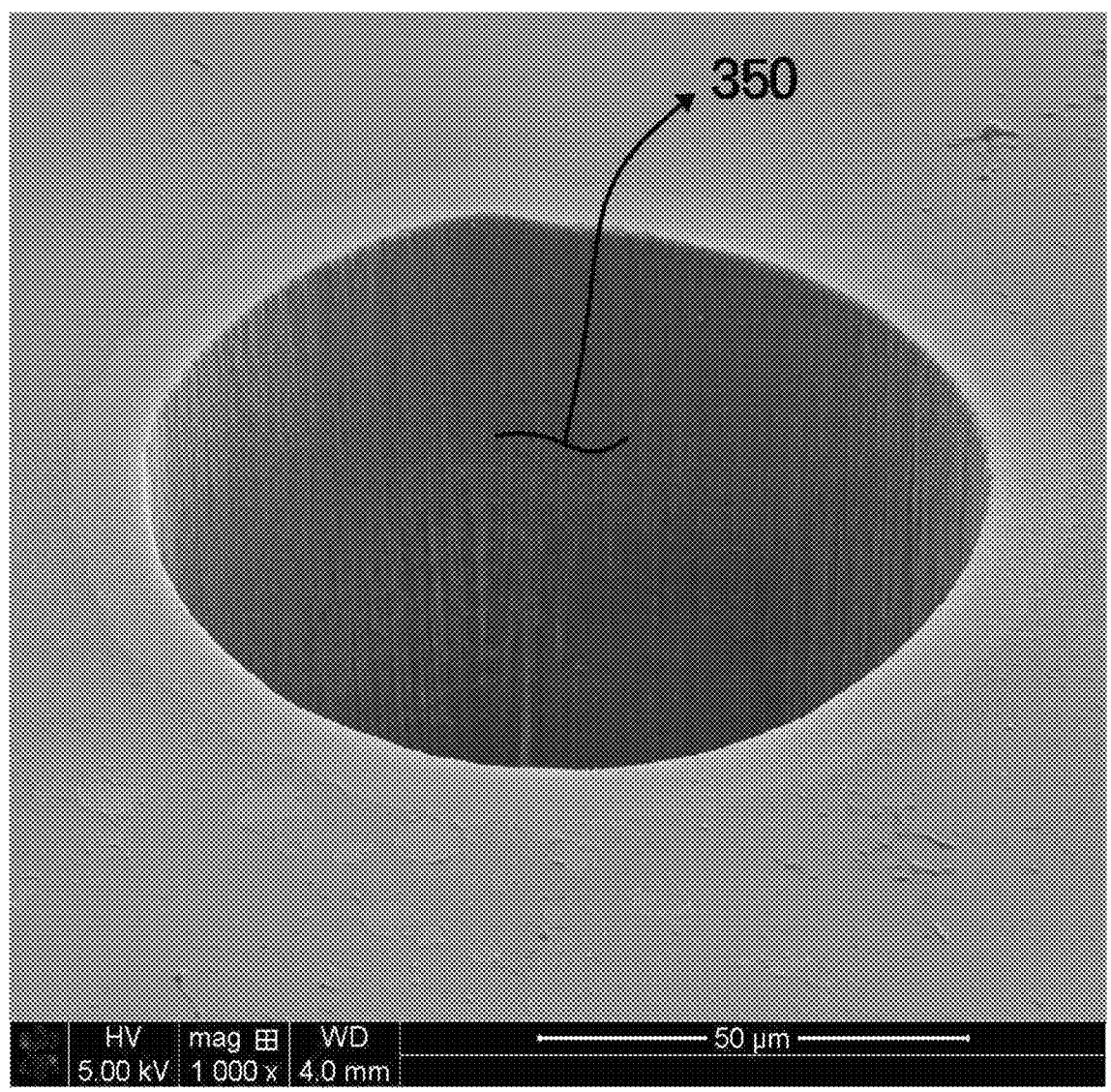
FIGS. 29 to 31 are photographs showing the anodic oxide films (fluid permeable anodic oxide films) according to the preferred embodiments of the present invention.
Figure 30:
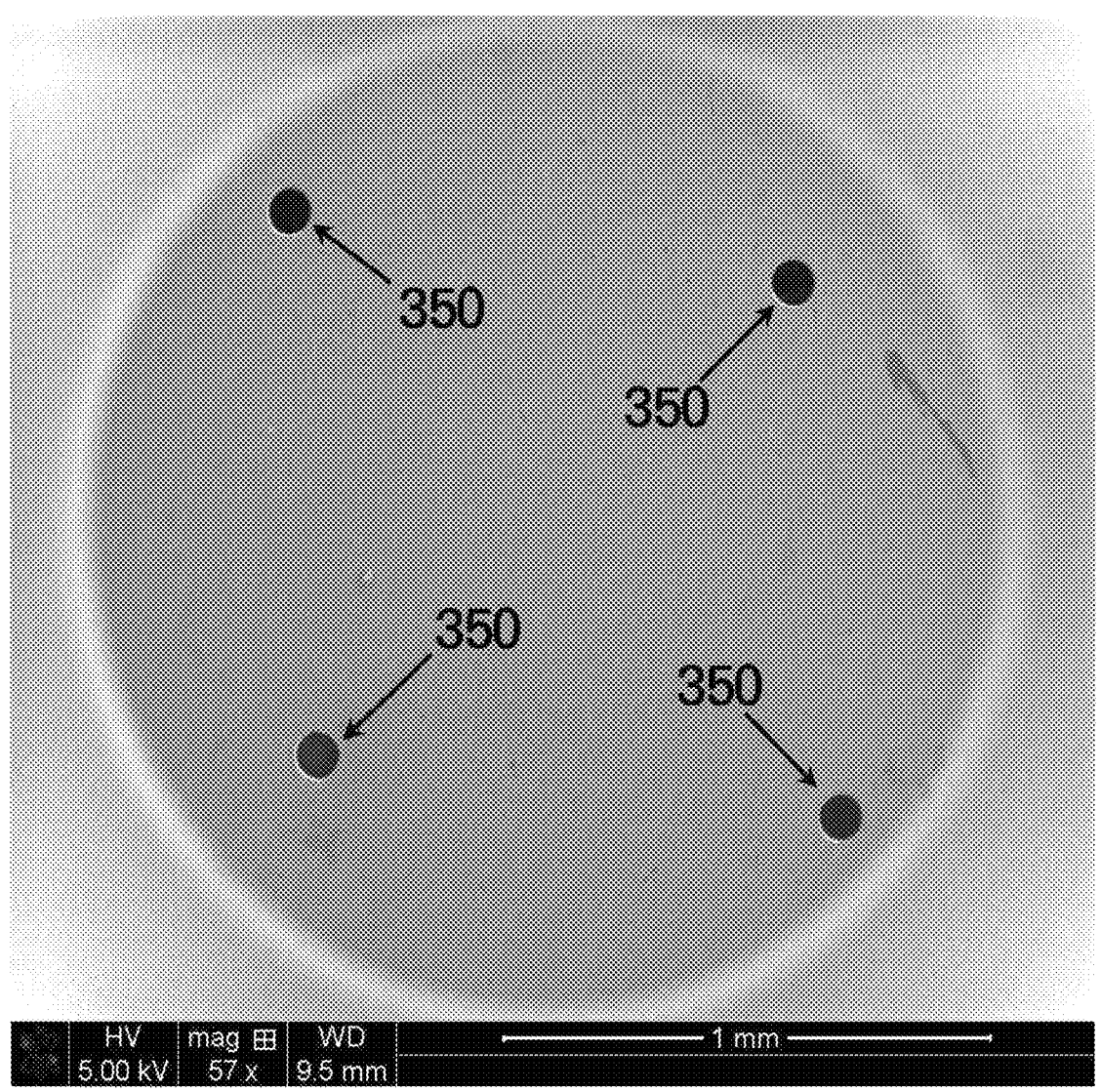
Figure 31:
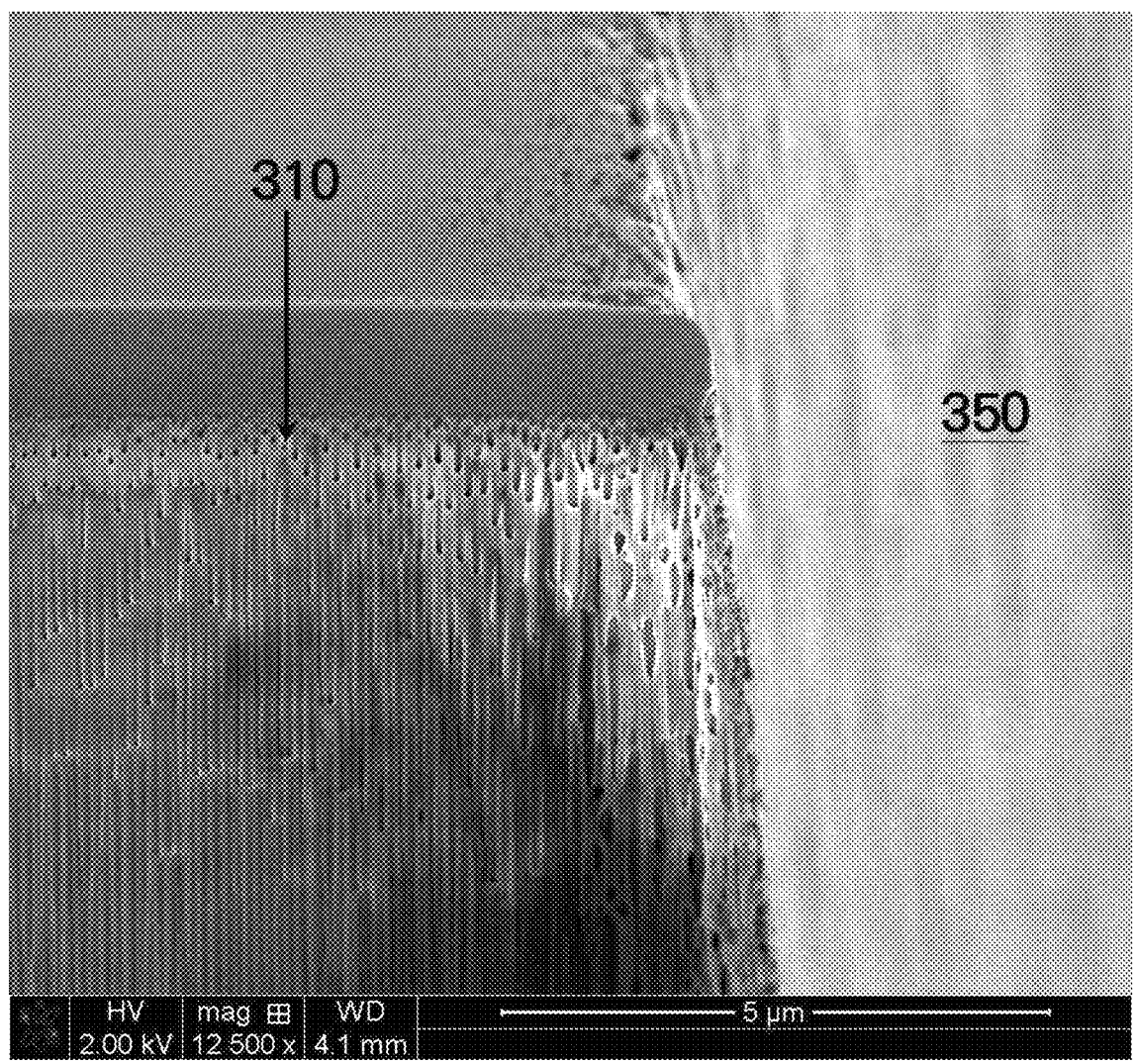

In the following descriptions, fluid permeable anodic oxide films and manufacturing methods thereof will be described with reference to FIGS. 2 to 7. Fluid permeable bodies which make use of anodic oxide films according to first and second embodiments of the present invention will be described with reference to FIGS. 9 to 18. Fluid permeable bodies which make use of anodic oxide films according to third to sixth embodiments of the present invention will be described with reference to FIGS. 19 to 28. FIGS. 29 to 31 are photographs showing the anodic oxide films (fluid permeable anodic oxide films) according to the preferred embodiments of the present invention.

Hereinafter, fluid permeable anodic oxide films and manufacturing methods thereof will be described with reference to FIGS. 2 to 7.

Figure 2:
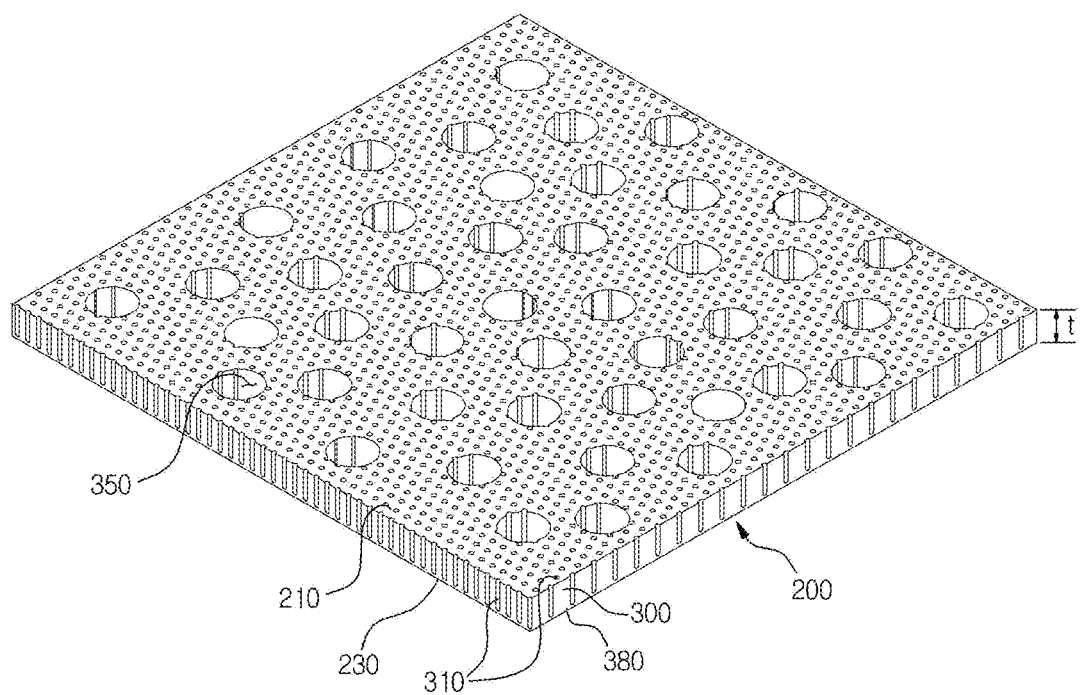
FIG. 2 is a perspective view of a fluid permeable anodic oxide film (including a barrier layer) according to a first preferred embodiment of the present invention.

As shown in FIG. 2, a fluid permeable anodic oxide film 200 according to a first preferred embodiment includes: a plurality of regularly-arranged pores 310 formed by anodizing metal; and a plurality of permeation holes 350 having an inner width larger than an inner width of the pores 310 and extending through the fluid permeable anodic oxide film 200.

As can be seen in FIG. 2, the fluid permeable anodic oxide film 200 according to the present invention is formed in a rectangular shape. However, the shape of the fluid permeable anodic oxide film 200 may be changed depending on the installation environment of the fluid permeable anodic oxide film 200.

The size and thickness of the fluid permeable anodic oxide films 200 and 200', the pores 310 and the permeation holes 350 are shown on an exaggerated scale for the sake of effective description of the technical content.

Figure 3:
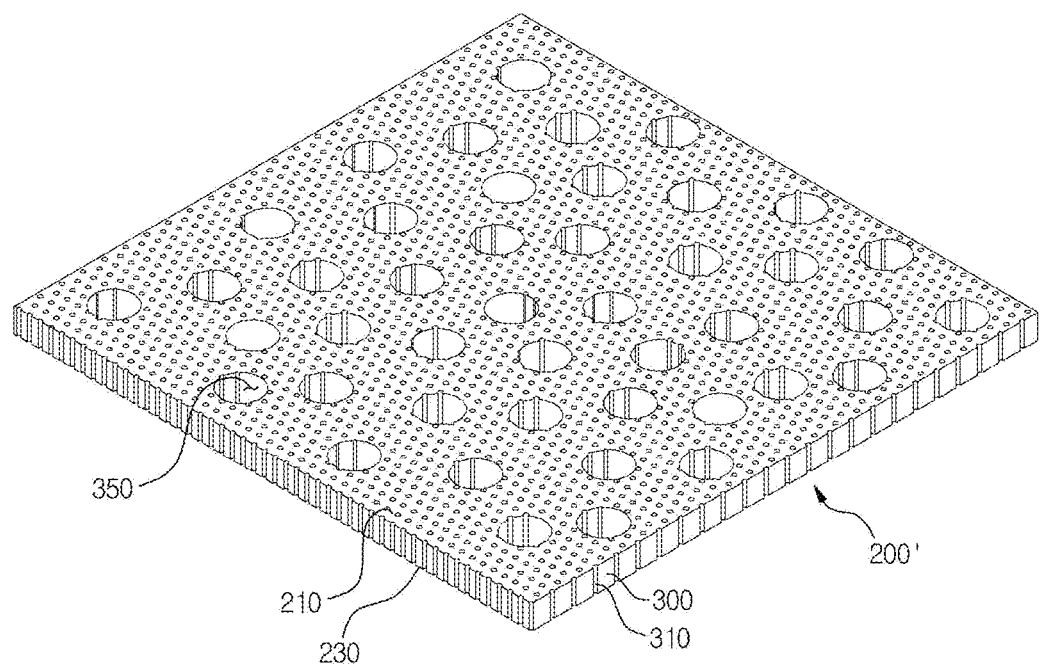
FIG. 3 is a perspective view of a fluid permeable anodic oxide film (not including a barrier layer) according to a second preferred embodiment of the present invention.
Figure 4:
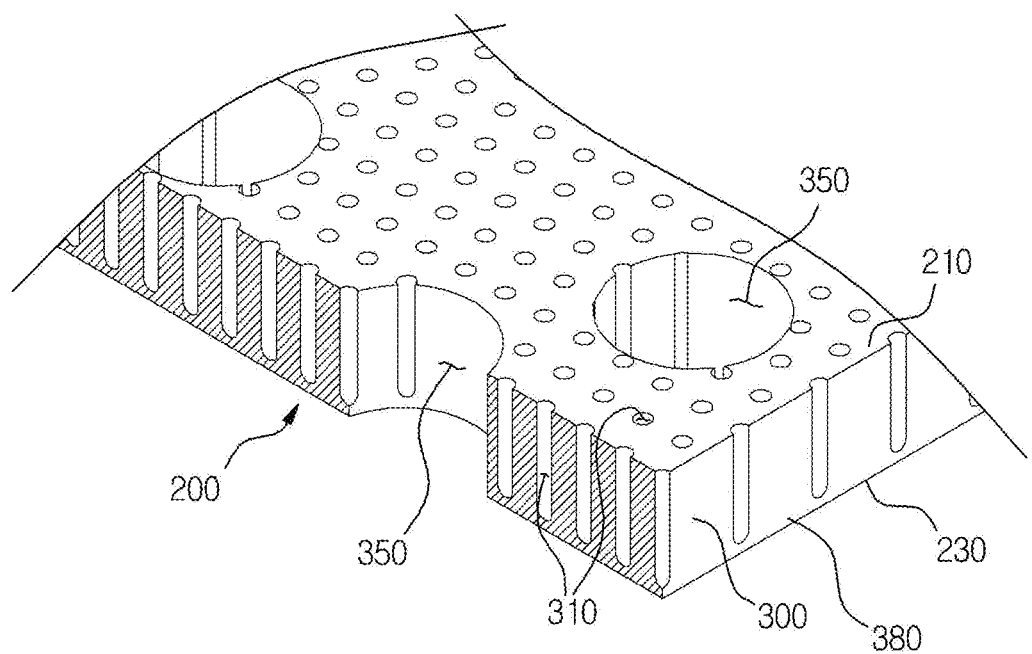
FIG. 4 is a partially-sectional perspective view of the fluid permeable anodic oxide film shown in FIG. 2.

As shown in FIGS. 2 to 4, the fluid permeable anodic oxide film 200 is formed by anodizing metal and then removing the metal. The fluid permeable anodic oxide film 200 according to a first embodiment of the present invention, which is shown in FIGS. 2 and 4, may include a porous layer 300 having pores 310 and a barrier layer 380 formed under the porous layer 300 and configured to close the pores 310.

Figure 5A:
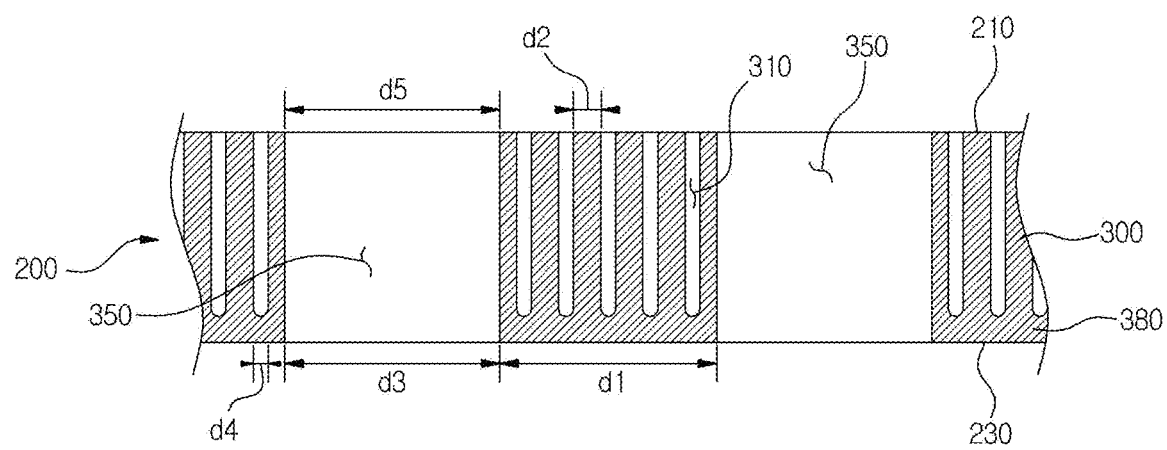
FIG. 5A is a partial sectional view of the fluid permeable anodic oxide film of the first embodiment shown in FIG. 2.

As shown in FIGS. 2, 4 and 5A, the pores 310 are formed in the fluid permeable anodic oxide film 200 so as to extend in an up-down direction. The pores 310 have upper ends formed so as to penetrate an upper surface 210 of the fluid permeable anodic oxide film 200 and lower ends closed by the barrier layer 380. The pores 310 are fluid-impermeable.

Figure 5B:
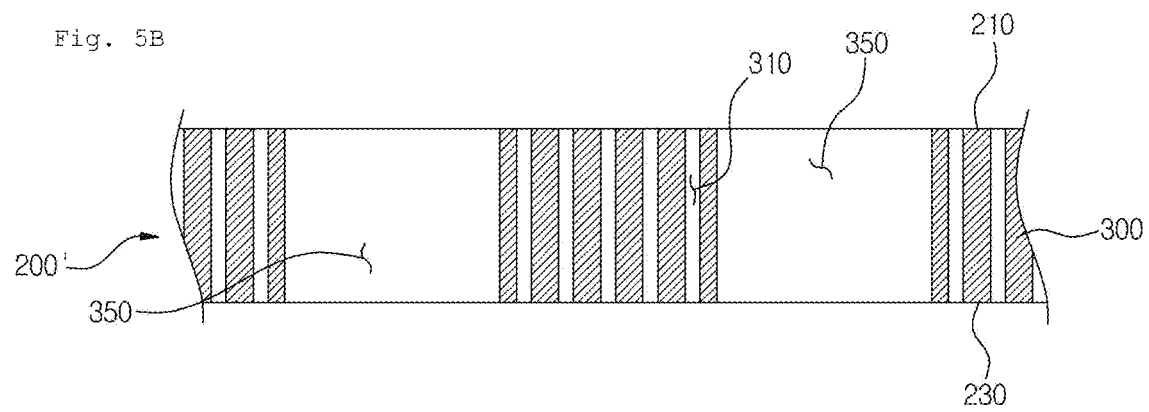
FIG. 5B is a partial sectional view of the fluid permeable anodic oxide film of the second preferred embodiment shown in FIG. 3.

As in the second embodiment of the present invention shown in FIGS. 3 and 5B, a fluid permeable anodic oxide film 200' may include only a porous layer 300 having a plurality of pores 310. In other words, after anodizing metal, the metal and the barrier layer 380 may be removed to form the fluid permeable anodic oxide film 200'. As a result, the pores 310 shown in FIGS. 3 and 5B vertically extends through the fluid permeable anodic oxide film 200'. In other words, the pores 310 are formed so as to penetrate an upper surface 210 and a lower surface 230 of the fluid permeable anodic oxide film 200'.

The pores 310 formed in the fluid permeable anodic oxide films 200 and 200' may have an inner width which falls within a range of several nanometers to 300 nanometers.

The metal used as a base material of the fluid permeable anodic oxide films 200 and 200' include aluminum-based metal. That is to say, the metal may preferably be aluminum or aluminum alloy. The fluid permeable anodic oxide films 200 and 200' may preferably be made of aluminum oxide obtained by anodizing aluminum-based metal.

In the meantime, the permeation holes 350 are formed so as to penetrate the upper surface 210 and the lower surface 230 of each of the fluid permeable anodic oxide films 200 and 200'. In the first embodiment shown in FIGS. 2, 4 and 5A, the permeation holes 350 are formed so as to extend through both the porous layer 300 and the barrier layer 380. In the second embodiment shown in FIGS. 3 and 5B, the permeation holes 350 are formed so as to extend through the porous layer 300.

The permeation holes 350 are formed in a plural number so as to penetrate the upper surface 210 and the lower surface 230 of each of the fluid permeable anodic oxide films 200 and 200'.

The pores 310 are positioned in a gap between the permeation holes 350. In other words, a plurality of pores 310 is positioned between two permeation holes 350. As shown in FIG. 5A, the spaced-apart distance d2 between two adjacent pores 310 is smaller than the spaced-apart distance d1 between two adjacent permeation holes 350 (d1>d2).

As shown in FIGS. 2 to 4, the inner width of the permeation holes 350 is larger than the inner width of the pores 310. As can be noted from the sectional view shown in FIG. 5A, the inner width d3 of the permeation holes 350 is set to become larger than the inner width d4 of the pores 310 (d3>d4).

The permeation holes 350 can be formed by etching the anodic oxide film 200. The permeation holes 350 are formed to extend parallel to the pores 310. As shown in FIG. 5A, the permeation holes 350 have an inner width remaining constant from one end of the fluid permeable anodic oxide film 200 to the other end of the fluid permeable anodic oxide film 200 (d3=d5). In other words, as shown in FIG. 5A, the inner width of each of the permeation holes 350 remains constant from the upper end to the lower end thereof. The permeation holes 350 have an inner width d3 which falls within a range of 300 nanometers to several millimeters.

In the meantime, as shown in FIG. 2, from the viewpoint of maintaining the structural stability during the passage of a fluid, the thickness t of the fluid permeable anodic oxide film 200 is set to fall within a range of 0.4 micrometers to 200 micrometers.

The fluid permeable anodic oxide film 200 is translucent. This is advantageous in that it is possible to check an amount of an impurity caught in the permeation holes 350.

Figure 6A:
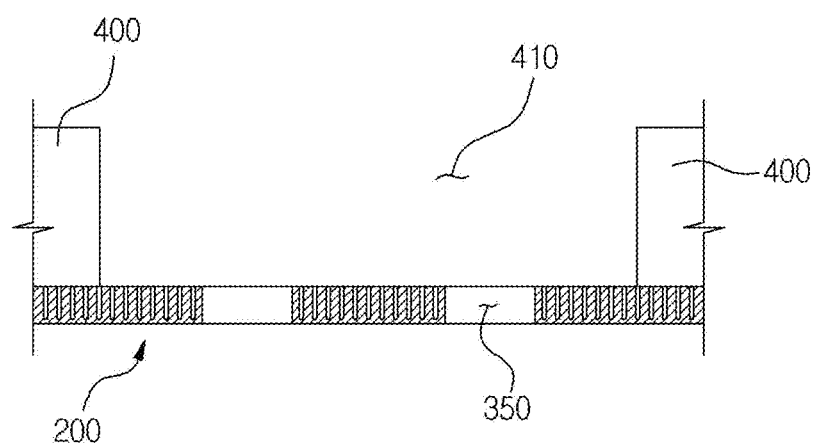
FIGS. 6A and 6B are views showing a state in which a fluid permeable anodic oxide film is bent at the time of fluid permeation.
Figure 6B:
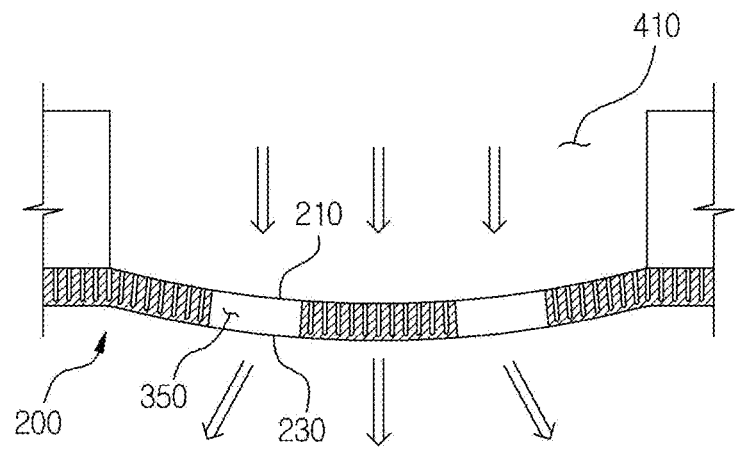

As shown in FIGS. 6A and 6B, the fluid permeable anodic oxide film 200 has pliability such that the fluid permeable anodic oxide film 200 can be bent in a fluid flow direction.

The pliability of the fluid permeable anodic oxide film 200 will now be described in more detail with reference to FIGS. 6A and 6B. In FIG. 6A, there is illustrated a cross-sectional state in which the fluid permeable anodic oxide film 200 is coupled to a lower surface of a fluid passing member 400. A plurality of through-holes 410 is formed in the fluid passing member 400.

Referring to FIG. 6B, when a fluid passes through the through-holes 410 of the fluid passing member 400 and flows toward the upper surface 210 of the fluid permeable anodic oxide film 200, the portion of the fluid permeable anodic oxide film 200 not fixed to the fluid passing member 400 in a corresponding relationship with the through-hole 410 is bent downward in a convex shape. In other words, the radii of curvature of the upper surface 210 and the lower surface 230 of the portion of the fluid permeable anodic oxide film 200 not fixed to the fluid passing member 400 in a corresponding relationship with the lower side of the through-hole 410 are reduced. This provides an effect of enlarging the lower end portions of permeation holes 350 adjoining the lower surface 230 of the fluid permeable anodic oxide film 200, thereby increasing a diffusion range of the fluid passing through the permeation holes 350.

As described above, each of the fluid permeable anodic oxide films 200 and 200' according to the present invention includes the permeation holes 350 having an inner width larger than an inner width of the pores 310. This enables a fluid to pass through the permeation holes 350 without clogging the permeation holes 350 and to be uniformly diffused.

Furthermore, unlike a conventional method in which each of the pores 310 is partially enlarged, the inner walls which define the pores 310 are not broken. This makes it possible to maintain the structural strength of the fluid permeable anodic oxide films 200 and 200'. Since the permeation holes 350 are formed by etching, it is easy to manufacture the fluid permeable anodic oxide films 200 and 200'.

Figure 7:
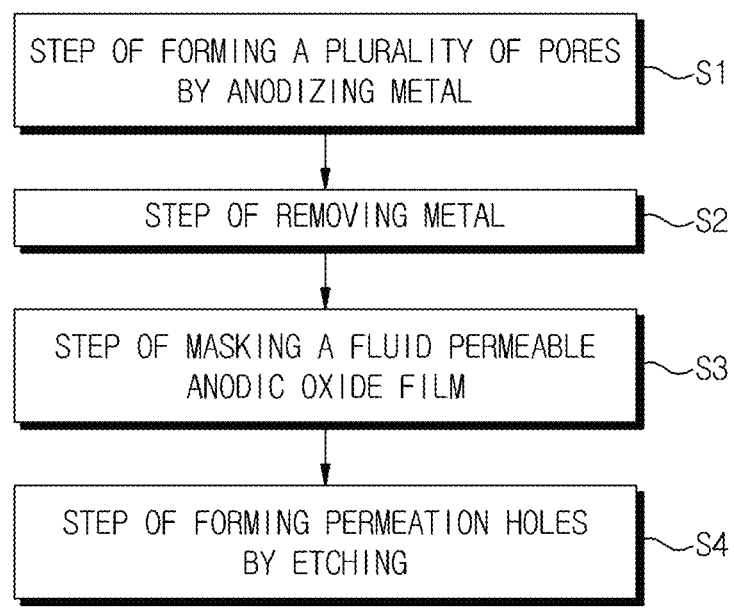
FIG. 7 is a block diagram showing a fluid permeable anodic oxide film manufacturing method.
Figure 8:
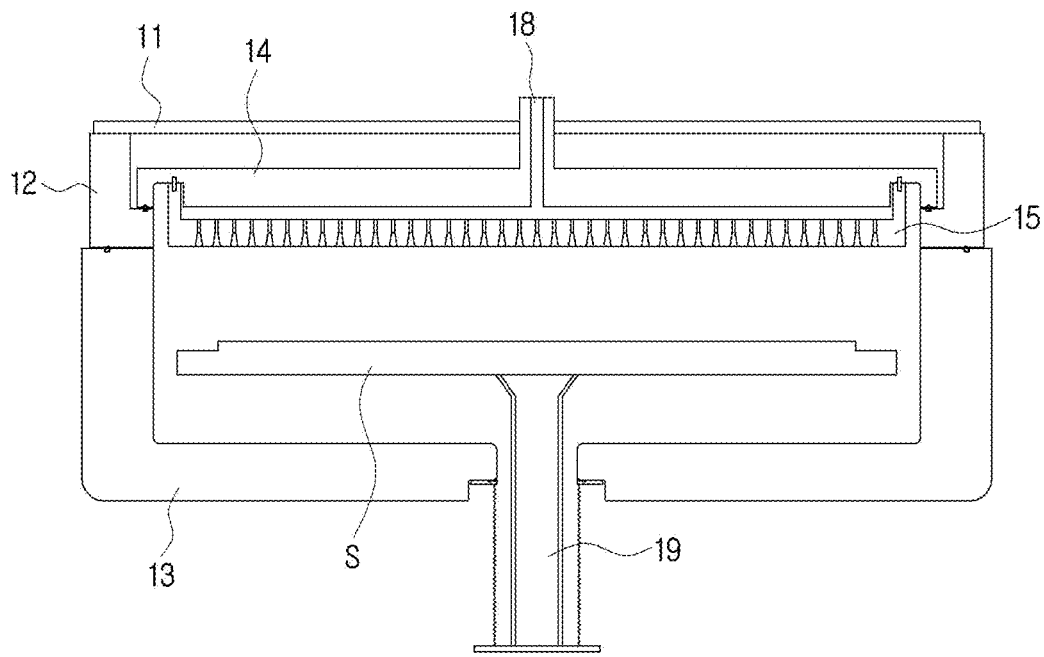
FIG. 8 is a sectional view of a vacuum chamber including a fluid passing member (diffuser) of prior art.

Hereinafter, a method of manufacturing a fluid permeable anodic oxide film 200 or 200' according to the present invention will be described with reference to FIG. 7.

The method of manufacturing a fluid permeable anodic oxide film 200 or 200' includes: a step (S1) of forming a plurality of regularly-arranged pores 310 in the fluid permeable anodic oxide film 200 or 200' by anodizing metal; a step (S2) of removing the metal; and a step (S3 and S4) of etching the fluid permeable anodic oxide film 200 or 200' having the pores 310 so as to form permeation holes 350 having an inner width larger than an inner width of the pores 310 and extending through the fluid permeable anodic oxide film 200 or 200'.

The step (S3 and S4) of etching the fluid permeable anodic oxide film 200 or 200' includes: a step (S3) of masking the fluid permeable anodic oxide film 200 or 200'; and a step (S4) of forming the permeation holes 350 by etching.

First, the step (S1) of forming the pores 310 is a step at which the pores 310 are formed by anodizing metal as a base material.

Secondly, the step (S2) of removing the metal is a step at which the metal as a base material is removed after anodizing the metal. When removing the metal, the porous layer 300 and the barrier layer 380 having the pores 310 may be left, or only the porous layer 300 having the pores 310 vertically extending through the porous layer 300 may be left.

Thirdly, the step (S3) of masking the fluid permeable anodic oxide film 200 or 200' is a step at which one surface of the fluid permeable anodic oxide film 200 or 200' is masked in conformity with a pattern of the permeation holes 350 to be formed. In other words, the step (S3) of masking the fluid permeable anodic oxide film 200 or 200' is a step at which a region other than the permeation hole formation region of the fluid permeable anodic oxide film 200 or 200' is covered in order to protect the region from an etching solution.

Fourthly, the step (S4) of etching the fluid permeable anodic oxide film 200 or 200' is a step at which the permeation holes 350 are formed using an etching solution. Only the non-masked region is etched by the etching solution to form the permeation holes 350.

As described above, the permeation holes 350 having an inner width larger than an inner width of the pores 310 can be easily formed by etching. In addition, it is possible to maintain the structural stability and to easily manufacture the fluid permeable anodic oxide film 200 or 200'.

Hereinafter, fluid permeable bodies which make use of the anodic oxide films according to the first and second embodiments of the present invention will be described with reference to FIGS. 9 to 18.

Figure 9:
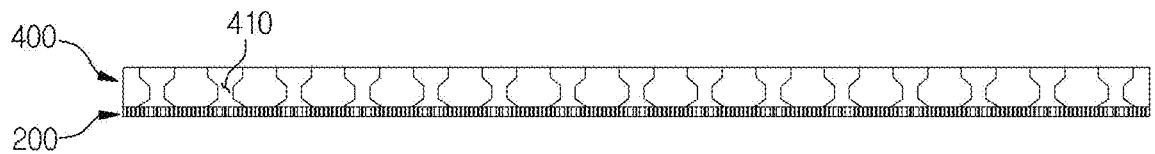
FIG. 9 is a sectional view of a fluid permeable body which makes use of the anodic oxide film according to the first preferred embodiment of the present invention.

Referring to FIGS. 9 to 11, a fluid permeable body which makes use of the anodic oxide film according to the first preferred embodiment of the present invention includes; a fluid passing member 400 having through-holes 410 through a fluid passes; and a fluid permeable anodic oxide film 200 coupled to the fluid passing member 400, wherein the fluid permeable anodic oxide film 200 includes a plurality of regularly-arranged pores 310 formed by anodizing metal and a plurality of permeation holes 350 having an inner width larger than an inner width of the pores 310 and extending through the fluid permeable anodic oxide film 200, the through-holes 410 communicating with the permeation holes 350.

The size and thickness of the fluid passing member 400, the through-holes 410, the fluid permeable anodic oxide film 200 or 200', the pores 310 and the permeation holes 350 shown in FIGS. 9 to 18 are shown on an exaggerated scale for the sake of effective description of the technical content.

Figure 18:
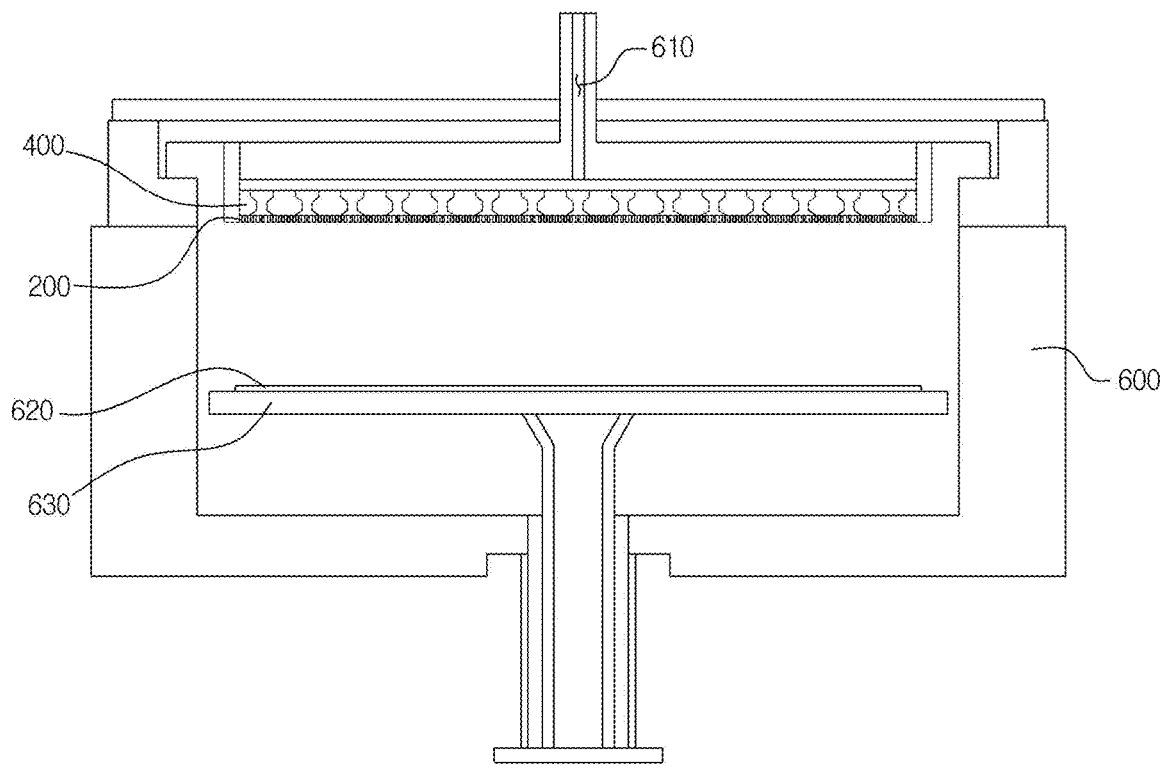
FIG. 18 is a sectional view showing a state in which the fluid permeable body according to the first preferred embodiment of the present invention is installed within a vacuum chamber.

As shown in FIG. 18, the fluid passing member 400 may be a diffuser installed within a vacuum chamber 600. The diffuser serves to allow a reaction gas introduced through an introduction part 610 to pass therethrough and to inject the reaction gas toward a glass 620 mounted on an upper surface of a susceptor 630. Since the diffuser installed within the vacuum chamber 600 is well-known in the art including the prior art described earlier, detailed descriptions thereof will be omitted herein.

The fluid passing member 400 of this embodiment may be a diffuser installed within a vacuum chamber 600 for manufacturing a liquid crystal display. In this case, the fluid passing member 400 may preferably have a rectangular parallelepiped shape. In the case of a semiconductor manufacturing apparatus, the diffuser may be formed in a disc shape. Needless to say, the shape of the fluid passing member 400 may be changed depending on the installation environment and condition thereof.

Figure 10A:
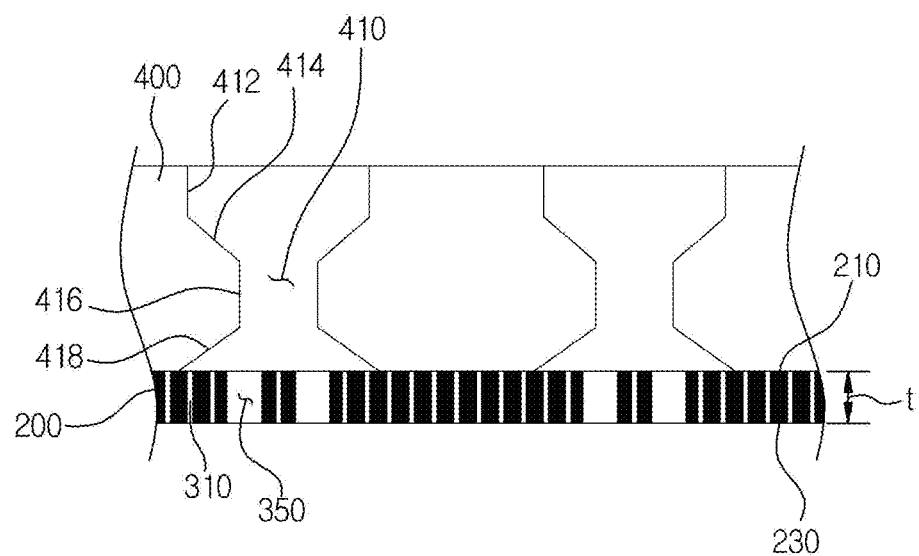
FIG. 10A is a partially-enlarged sectional view of the fluid permeable body shown in FIG. 9.
Figure 10B:
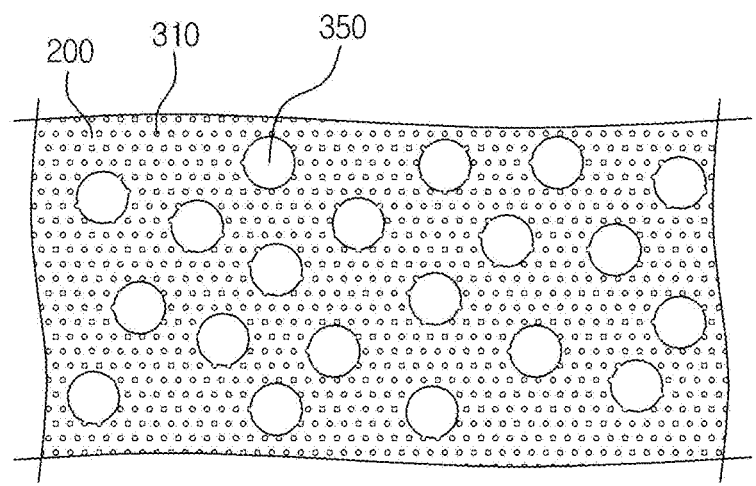
FIG. 10B is a bottom view of the fluid permeable body shown in FIG. 10A.

As shown in FIGS. 9 and 10, a plurality of through-holes 410 is formed in the fluid passing member 400. A fluid can pass through the through-holes 410. As shown in FIG. 10A, the through-holes 410 are formed so that a middle portion thereof is narrower than upper and lower portions thereof.

Each of the through-holes 410 includes a first part 412 positioned in an upper portion thereof and configured to introduce a reaction gas, a second part 414 extending downward from a lower end of the first part 412 so that an inner width thereof grows smaller downward, a third part 416 vertically extending downward from a lower end of the second part 414, and a fourth part 418 extending downward from a lower end of the third part 416 so that an inner width thereof grows larger downward.

A reaction gas introduced into the first part 412 of each of the through-holes 410 sequentially passes through the second part 414, the third part 416 and the fourth part 418 and then flows toward the fluid permeable anodic oxide film 200.

As illustrated in FIG. 10A, the first part 412 is defined by an inner wall which is formed to extend vertically.

The second part 414 is positioned between the first part 412 and the third part 416 and is defined by an inner wall which is obliquely formed so that an inner width thereof grows smaller downward.

The third part 416 is positioned between the second part 414 and the fourth part 418 and is defined by an inner wall which is formed to extend vertically. The third part 416 has an inner width smaller than an inner width of an upper end of the first part 412 and a lower end of the fourth part 418. The third part 416 serves to reduce the pressure of the reaction gas and to increase the flow velocity of the reaction gas.

The fourth part 418 has an upper end connected to a lower end of the third part 416 and is formed so that an inner width thereof grows larger downward. The reaction gas passed through the third part 416 is diffused and injected toward the fluid permeable anodic oxide film 200 through the fourth part 418. The lower end portion of the fourth part 418 may make contact with the upper surface 210 of the fluid permeable anodic oxide film 200. The fluid permeable anodic oxide film 200 is coupled to the lower surface of the fluid passing member 400.

In this embodiment, the fluid permeable anodic oxide film 200 may preferably have a shape corresponding to the shape of the fluid passing member 400. Furthermore, the outer periphery of the fluid permeable anodic oxide film 200 may have a size approximately equal to the size of the outer periphery of the fluid passing member 400.

The fluid permeable anodic oxide film 200 includes: a plurality of regularly-arranged pores 310 formed by anodizing metal; and a plurality of permeation holes 350 having an inner width larger than an inner width of the pores 310 and extending through the fluid permeable anodic oxide film 200.

The fluid permeable anodic oxide film 200 is formed by anodizing a base metal and then removing the base metal.

Figure 11A:
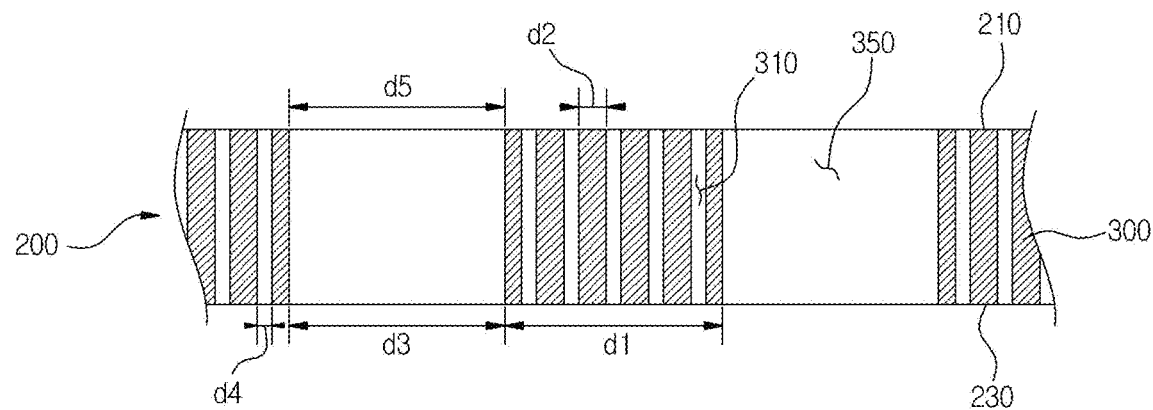
FIGS. 11A and 11B are views showing modifications of the fluid permeable anodic oxide film.

As shown in FIGS. 10, 11A, the fluid permeable anodic oxide film 200 may include only a porous layer 300 having pores 310. In other words, after anodizing metal, it may be possible to remove not only the metal but also the barrier layer 380. Thus, the pores 310 shown in FIGS. 10 and 11A vertically extend through the fluid permeable anodic oxide film 200. In other words, the pores 310 are formed to penetrate the upper surface 210 and the lower surface 230 of the fluid permeable anodic oxide film 200.

Figure 11B:
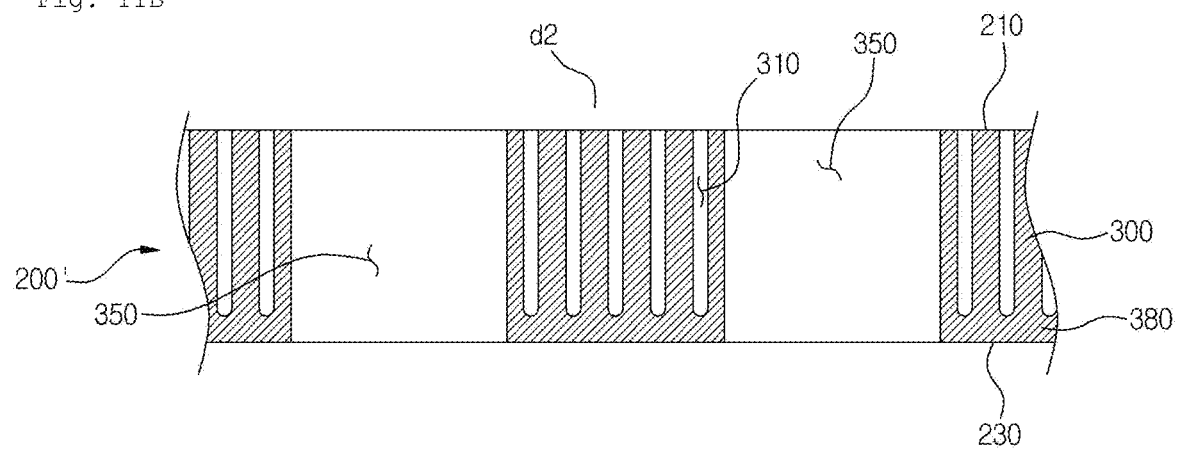

Alternatively, as shown in FIG. 11B, the fluid permeable anodic oxide film 200' may include a porous layer 300 having pores 310 and a barrier layer 380 formed under the porous layer 300 and configured to close one ends of the pores 310.

In the fluid permeable anodic oxide film 200' shown in FIG. 11B, a plurality of pores 310 is formed to extend in an up-down direction. The upper ends of the pores 310 are formed so as to penetrate the upper surface 210 of the fluid permeable anodic oxide film 200, namely the upper surface 210 of the porous layer 300. The lower ends of the pores 310 are closed by the barrier layer 380.

In the fluid permeable anodic oxide film 200 or 200' shown in FIGS. 11A and 11B, the pores 310 have an inner width d4 which falls within a range of several nanometers to 300 nanometers.

The metal used as a base material of the fluid permeable anodic oxide film 200 or 200' includes aluminum-based metal. The aluminum-based metal may preferably be aluminum or aluminum alloy. The fluid permeable anodic oxide film 200 or 200' may preferably be made of aluminum oxide obtained by anodizing aluminum-based metal.

In the meantime, permeation holes 350 are formed so as to penetrate the upper surface 210 and the lower surface 230 of the fluid permeable anodic oxide film 200 or 200'. The permeation holes 350 shown in FIGS. 10 and 11A are formed to penetrate the porous layer 300. The permeation holes 350 shown in FIG. 11B are formed to penetrate both the porous layer 300 and the barrier layer 380. The permeation holes 350 are formed in a plural number so as to penetrate the upper surface 210 and the lower surface 230 of the fluid permeable anodic oxide film 200 or 200'.

As shown in FIGS. 10A, 10B, 11A and 11B, a plurality of pores 310 is positioned in a gap between the permeation holes 350. In other words, a plurality of pores 310 is positioned between two permeation holes 350 adjoining each other. As shown in FIG. 11A, the spaced-apart distance d2 between two adjacent pores 310 is smaller than the spaced-apart distance d1 between two adjacent permeation holes 350 (d1>d2).

As shown in FIGS. 10A, 10B, 11A and 11B, the inner width of the permeation holes 350 is larger than the inner width of the pores 310. As can be noted from the sectional view shown in FIG. 11A, the inner width d3 of the permeation holes 350 is set to become larger than the inner width d4 of the pores 310 (d3>d4).

The permeation holes 350 can be formed by etching the anodic oxide film 200. The permeation holes 350 are formed to extend parallel to the pores 310. As shown in FIG. 11A, the permeation holes 350 have an inner width remaining constant from one end of the fluid permeable anodic oxide film 200 to the other end of the fluid permeable anodic oxide film 200 (d3=d5). In other words, the inner width of each of the permeation holes 350 remains constant from the upper end to the lower end thereof. The permeation holes 350 have an inner width d3 which falls within a range of 300 nanometers to several millimeters.

In the meantime, as shown in FIG. 10A, the thickness t of the fluid permeable anodic oxide film 200 is set to fall within a range of 0.4 micrometers to 200 micrometers.

The fluid permeable anodic oxide film 200 is made of a translucent material. It is therefore possible to check the amount of an impurity caught in the permeation holes 350.

A plurality of permeation holes 350 may correspond to and communicate with one of the through-holes 410 formed in the fluid passing member 400. In the sectional view of FIG. 10A, two permeation holes 350 are disposed below one of the through-holes 410 within the extent of an inner width of one of the through-holes 410. Alternatively, three or more permeation holes 350 may be disposed within the extent of an inner width of one of the through-holes 410 and may communicate with one of the through-holes 410.

As described above, the fluid permeable anodic oxide film 200 having the permeation holes 350 is coupled to the fluid passing member 400 having the through-holes 410. This makes it possible to improve the diffusion uniformity of a fluid.

Furthermore, the fluid permeable anodic oxide film 200 may be coupled to an existing fluid passing member 400. Thus, the manufacturing process is simple and easy to perform.

Hereinafter, modifications of the installation position of the fluid permeable anodic oxide film 200 will be described with reference to FIG. 12.

Figure 12A:
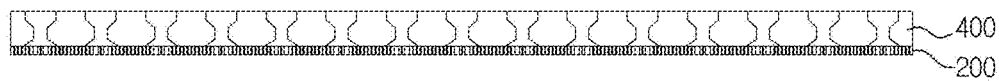
FIGS. 12A to 12D are views showing modifications of the fluid permeable body shown in FIG. 9.
Figure 12B:
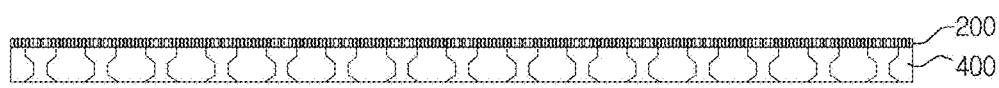

As shown in FIGS. 12A and 12B, the fluid permeable anodic oxide film 200 may be coupled to any one of the lower surface and the upper surface of the fluid passing member 400.

FIG. 12A shows a state in which the fluid permeable anodic oxide film 200 is coupled to the lower surface of the fluid passing member 400 as in the first embodiment shown in FIG. 9. In FIG. 12B, there is shown a state in which the fluid permeable anodic oxide film 200 is coupled to the upper surface of the fluid passing member 400.

Figure 12C:
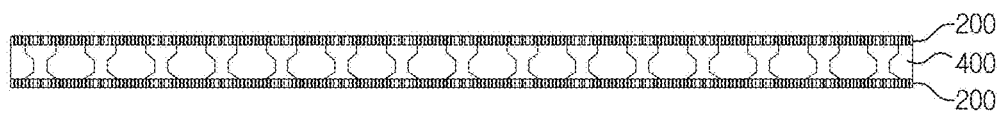
Figure 12D:
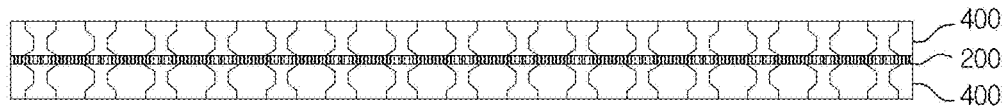

Furthermore, as shown in FIG. 12C, two fluid permeable anodic oxide films 200 may be coupled to the upper surface and the lower surface of the fluid passing member 400. Moreover, as shown in FIG. 12D, two or more fluid passing members 400 may be coupled to the fluid permeable anodic oxide film 200. The fluid permeable anodic oxide film 200 may be fixed to one surface of at least one of the fluid passing members 400. In the example shown in FIG. 12D, two fluid passing members 400 are spaced apart from each other in an up-down direction and the fluid permeable anodic oxide film 200 is disposed between the two fluid passing members 400. The fluid permeable anodic oxide film 200 makes contact with the mutually-facing surfaces of the two spaced-apart fluid passing members 400.

The fluid permeable anodic oxide film 200 has pliability such that the fluid permeable anodic oxide film 200 can be bent in a fluid flow direction.

When the fluid permeable anodic oxide film 200 is coupled to the lower surface of the fluid passing member 400 as shown in FIGS. 10A and 12A, if a fluid passes through the through-holes 410 of the fluid passing member 400 and flows toward the upper surface 210 of the fluid permeable anodic oxide film 200, the portion of the fluid permeable anodic oxide film 200 not fixed to the fluid passing member 400 in a corresponding relationship with the through-hole 410 is bent downward in a convex shape. In other words, the radii of curvature of the upper surface 210 and the lower surface 230 of the portion of the fluid permeable anodic oxide film 200 not fixed to the fluid passing member 400 in a corresponding relationship with the lower side of the through-hole 410 are reduced. This provides an effect of enlarging the lower end portions of permeation holes 350 adjoining the lower surface 230 of the fluid permeable anodic oxide film 200, thereby increasing a diffusion range of the fluid passing through the permeation holes 350.

As described above, each of the fluid permeable anodic oxide films 200 and 200' includes the permeation holes 350 having an inner width larger than an inner width of the pores 310. This enables a fluid to pass through the permeation holes 350 without clogging the permeation holes 350 and to be uniformly diffused. Furthermore, unlike a case in which each of the pores 310 is partially enlarged, the inner walls which define the pores 310 are not broken. This makes it possible to maintain the structural strength of the fluid permeable anodic oxide films 200 and 200'. Since the permeation holes 350 are formed by etching, it is easy to manufacture the fluid permeable anodic oxide films 200 and 200'.

A metal portion 510, 520, 525 or 540 may be disposed on the upper surface 210 or the lower surface 230 of the fluid permeable anodic oxide film 200.

Figure 13:
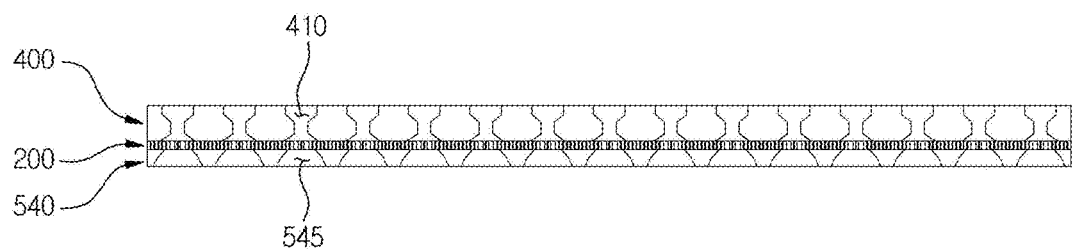
FIG. 13 is a sectional view of a fluid permeable body which makes use of the anodic oxide film according to the second preferred embodiment of the present invention.
Figure 14A:
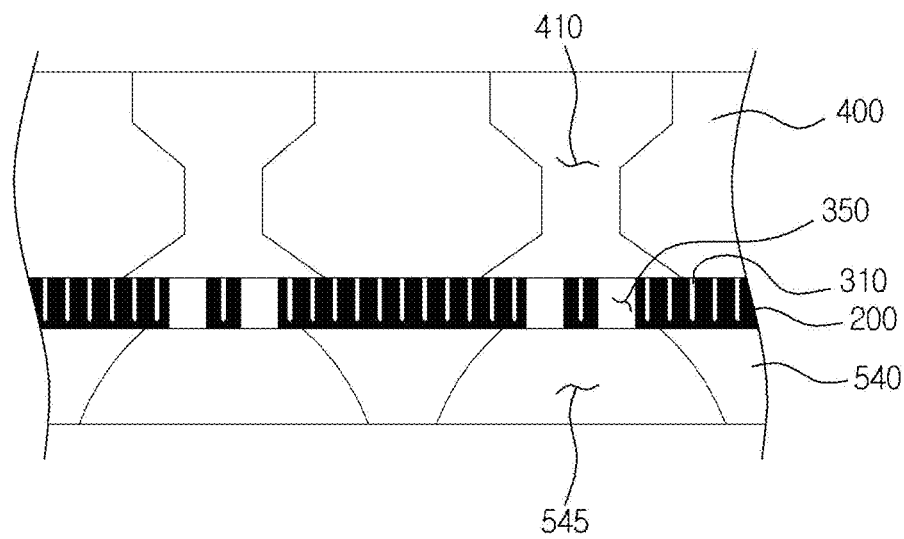
FIG. 14A is a partially-enlarged sectional view of the fluid permeable body shown in FIG. 13.
Figure 14B:
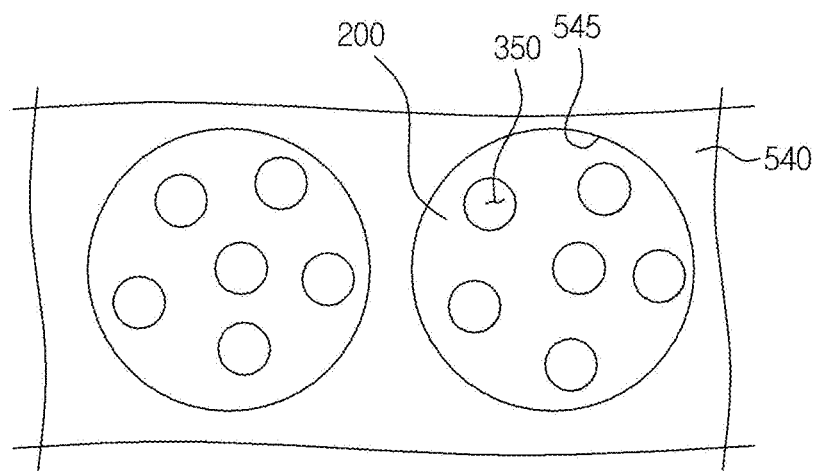
FIG. 14B is a bottom view of the fluid permeable body shown in FIG. 14A.

The fluid permeable body according to a second embodiment of the present invention, which is shown in FIGS. 13, 14A and 14B, includes a metal portion disposed on the lower surface 230 of the fluid permeable anodic oxide film 200. Hereinafter, the metal portion shown in FIGS. 13, 14A and 14B will be referred to as base metal portion 540.

Figure 15A:
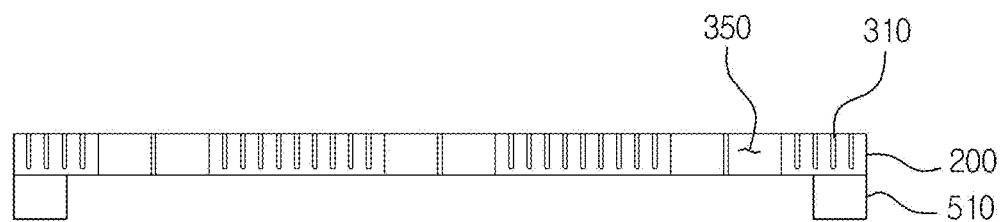
FIGS. 15A and 15B and FIGS. 16A to 16D are sectional views and bottom views showing different examples of a fluid permeable anodic oxide film and first and second metal portions formed on one surface of the fluid permeable anodic oxide film.
Figure 15B:
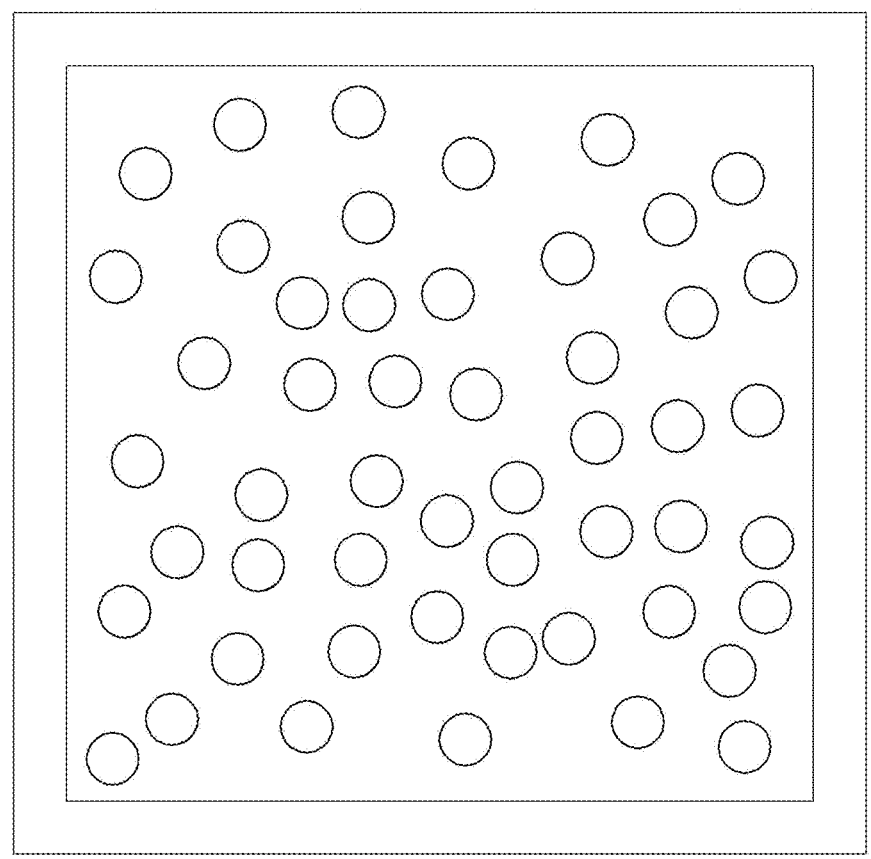

The metal portion shown in FIGS. 15A and 15B will be referred to as first metal portion 510. The metal portions shown in FIGS. 16A to 16D will be referred to as second metal portions 520a, 520b and 520c.

In the fluid permeable body according to the second embodiment shown in FIGS. 13, 14A and 14B, the fluid permeable anodic oxide film 200 is integrally formed with the base metal portion 540 disposed on the lower surface thereof. More specifically, after anodizing a base metal, the base metal is not removed. The base metal corresponds to the base metal portion 540 disposed on the lower surface of the fluid permeable anodic oxide film 200.

As shown in FIGS. 13, 14A and 14B, the base metal portion 540 is disposed under the fluid permeable anodic oxide film 200 in a corresponding relationship with the entirety of the lower surface of the fluid permeable anodic oxide film 200. Through-holes 545 communicating with the permeation holes 350 are formed in the base metal portion 540.

The through-holes 545 are formed in a plural number. The inner width of the through-holes 545 is set to become larger than the inner width of the permeation holes 350. Furthermore, the inner width of the through-holes 545 grows smaller upward. In other words, the inner width of the through-holes 545 grows smaller toward the lower surface of the fluid permeable anodic oxide film 200. The inner width of the upper end of each of the through-holes 545 making contact with the lower surface of the fluid permeable anodic oxide film 200 is set to become larger than the inner width of the permeation holes 350. This structure may be obtained by disposing the anodic oxide film 200 above the base metal portion 540, partially etching the base metal portion 540 to form the through-holes 545, and then etching the anodic oxide film 200 to form the permeation holes 350.

As shown in FIGS. 14A and 14B, the through-holes 545 are disposed below the permeation holes 350 and the pores 310. A plurality of permeation holes 350 may correspond to and communicate with one of the through-holes 545 within the extent of the inner width of one of the through-holes 545. One or more permeation holes 350 are disposed above each of the through-holes 545 so as to correspond to and communicate with each of the through-holes 545.

After passing through the through-holes 410 and the permeation holes 350, a reaction gas is injected downward through the through-holes 545. The same parts of the second embodiment as those of the first embodiment will not be described.

Hereinafter, the first metal portion 510 and the second metal portions 520a, 520b and 520c will be described with reference to FIGS. 15A and 15B and FIGS. 16A to 16D. The first metal portion 510 and the second metal portions 520a, 520b and 520c serve to enhance the strength of the anodic oxide film 200 and to couple the anodic oxide film 200 to other components.

As shown in FIGS. 15A and 15B, the first metal portion 510 is formed in the outer periphery portion of the fluid permeable anodic oxide film 200. More specifically, the first metal portion 510 is formed in the outer periphery portion of the lower surface of the fluid permeable anodic oxide film 200. The first metal portion 510 may be formed by anodizing metal and then removing the central portion (or the inner portion) of the metal while leaving the outer periphery portion of the metal. Thus, as shown in FIG. 15A, the first metal portion 510 protrudes downward from the outer periphery of the lower surface of the fluid permeable anodic oxide film 200. The central portion (inner portion) of the lower surface of the fluid permeable anodic oxide film 200 is opened downward. That is to say, as can be noted from the bottom view of FIG. 15B, the central portion of the lower surface of the fluid permeable anodic oxide film 200 is opened.

Figure 17A:
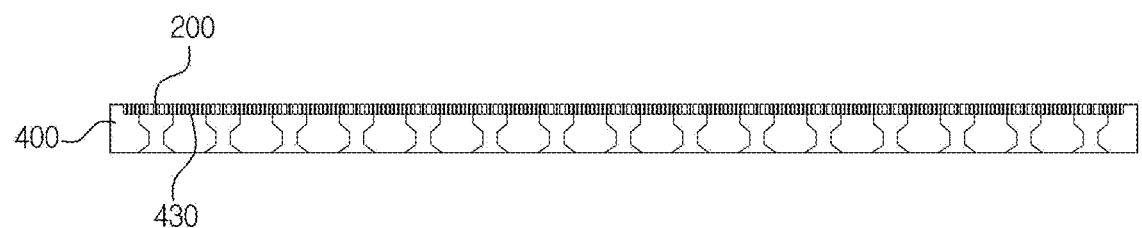
FIGS. 17A to 17C are sectional views showing different examples of a fluid permeable anodic oxide film installing method.
Figure 17B:
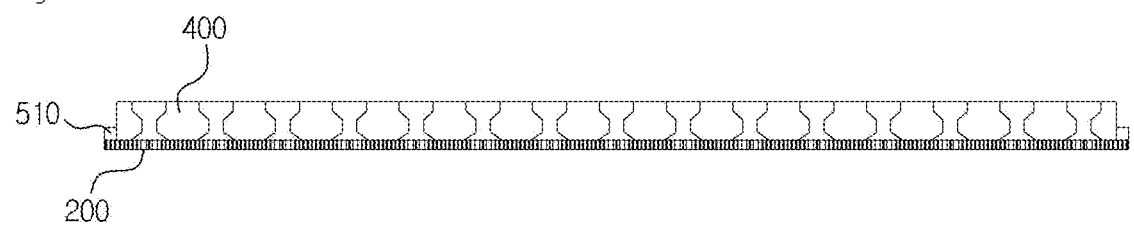

As shown in FIG. 17B, the first metal portion 510 shown in FIGS. 15A and 15B can be used for coupling the fluid permeable anodic oxide film 200 to the fluid passing member 400. The first metal portion 510 may be coupled to the fluid passing member 400 by, for example, welding or other methods.

As shown in FIGS. 16A to 16D, the second metal portions 520a, 520b and 520c are formed in a plural number in a spaced-apart relationship with one another. The second metal portions 520a, 520b and 520c are spaced apart from one another with spaces 550 interposed therebetween and may be partially connected to one another.

Figure 16A:
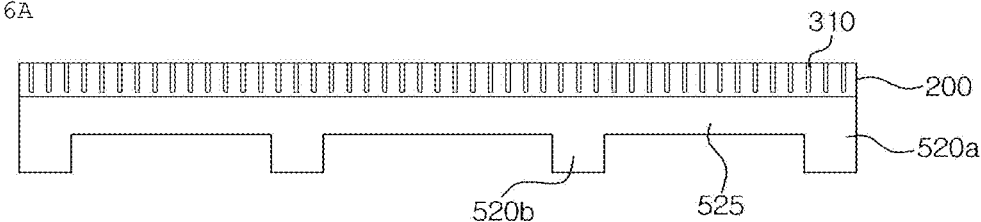
Figure 16B:
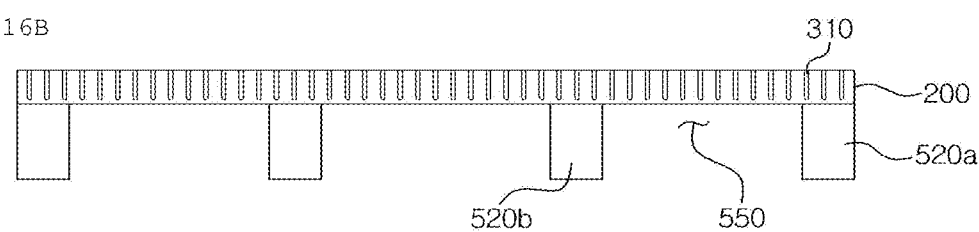
Figure 16C:
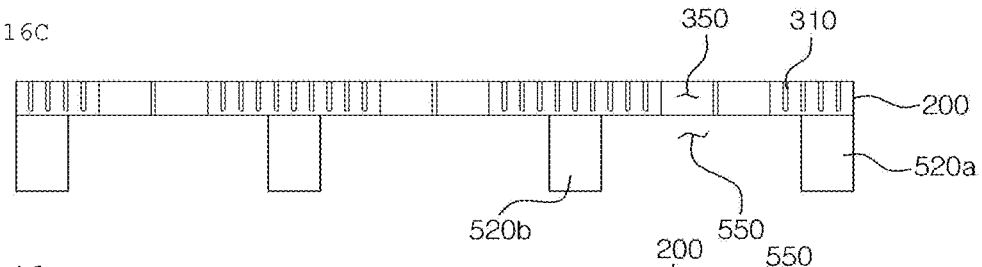
Figure 16D:
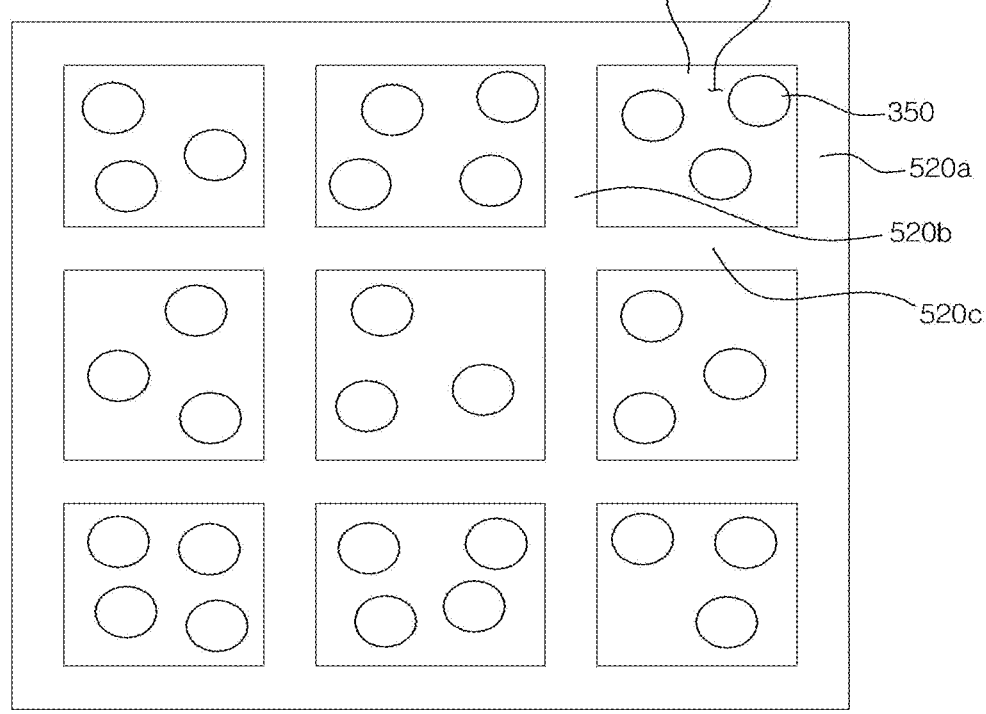

More specifically, as shown in FIG. 16D, the second metal portions 520a, 520b and 520c includes a second metal portion 520a formed in the outer periphery portion of the lower surface of the fluid permeable anodic oxide film 200, a plurality of second metal portions 520b formed inside the second metal portion 520a in a mutually-spaced-apart parallel relationship, and a plurality of second metal portions 520c formed in a mutually-spaced-apart parallel relationship so as to be orthogonal to the second metal portions 520b.

The second metal portions 520b and the second metal portions 520c are connected to the second metal portion 520a at the opposite ends thereof. The remaining portions of the second metal portions 520b and the second metal portions 520c are spaced apart from the second metal portion 520a. The second metal portions 520b and the second metal portions 520c are orthogonal to each other so as to form a lattice pattern. Spaces 550 are defined by the second metal portion 520a, the second metal portions 520b and the second metal portions 520c. The spaces 550 are positioned below the fluid permeable anodic oxide film 200 so that the permeation holes 350 communicate with the spaces 550. A reaction gas passed through the permeation holes 350 is injected downward through the spaces 550.

A method of forming the second metal portions 520a, 520b and 520c will now be described with reference to FIGS. 16A to 16D.

First, as shown in FIG. 16A, a base metal to be anodized to form the fluid permeable anodic oxide film 200 includes not only the second metal portion 520a, the second metal portions 520b and second metal portions 520c but also third metal portions 525 configured to close the spaces 550.

After the fluid permeable anodic oxide film 200 is formed by anodizing the base metal shown in FIG. 16A, the third metal portions 525 are removed as shown in FIG. 16B.

Thereafter, as shown in FIG. 16C, the permeation holes 350 are formed so as to vertically penetrate the fluid permeable anodic oxide film 200. Thus, the second metal portions 520a, 520b and 520c and the permeation holes 350 are formed as shown in FIGS. 16C and 16D.

The second metal portions 520a, 520b and 520c are configured to support the lower surface of the fluid permeable anodic oxide film 200, thereby preventing the fluid permeable anodic oxide film 200 from being excessively bent downward when a fluid passes through the fluid permeable anodic oxide film 200.

A method of coupling the fluid permeable anodic oxide film 200 to the fluid passing member 400 will now be described with reference to FIGS. 17A to 17C.

As shown in FIG. 17A, a seating portion having a seating groove 430 may be formed on the upper surface of the fluid passing member 400. The fluid permeable anodic oxide film 200 is seated on the seating portion. The seating portion includes the seating groove 430 and the upper surface of the fluid passing member 400 adjoining the upper end of the seating groove 430.

More specifically, the seating groove 430 may be defined by a rectangular rim and may be formed in a recessed shape so that the fluid permeable anodic oxide film 200 can be inserted into the seating groove 430. Thus, as shown in FIG. 16A, the fluid permeable anodic oxide film 200 can be wholly inserted and seated into the seating groove 430. As an alternative example, the fluid permeable anodic oxide film 200 may be partially inserted and seated into the seating groove 430.

In the example shown in FIG. 17B, as described above, the first metal portion 510 is fixed to the fluid passing member 400 by welding or other methods as shown in FIGS. 15A and 15B. Then, the fluid permeable anodic oxide film 200 is coupled to the fluid passing member 400.

Figure 17C:
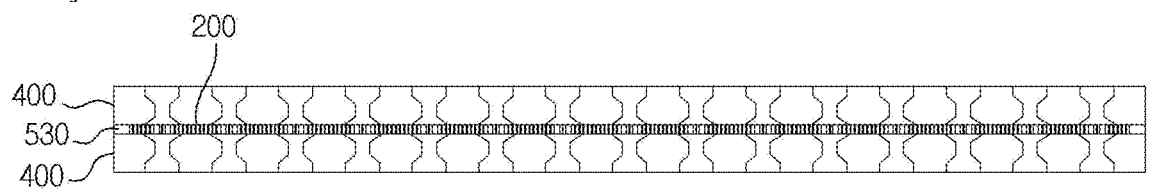

As shown in FIG. 17C, the fluid permeable anodic oxide film 200 may be disposed between two fluid passing members 400 stacked one above the other. As the fluid passing members 400 are combined together, the fluid permeable anodic oxide film 200 may be fixed in place.

Descriptions will be made in more detail with reference to FIG. 17C. Two fluid passing members 400 spaced apart in an up-down direction are combined together using the combining members 530 disposed in the outer periphery portions of the fluid passing members 400. The fluid permeable anodic oxide film 200 is fixed between the two fluid passing members 400 spaced apart from each other. The upper surface and the lower surface of the fluid permeable anodic oxide film 200 are brought into contact with and compressed by the fluid passing members 400 disposed at the upper and lower sides of the fluid permeable anodic oxide film 200.

As shown in FIG. 18, the fluid passing member 400 may be, for example, a diffuser installed within a vacuum chamber 600 for manufacturing a liquid crystal display. A reaction gas introduced through an introduction part 610 passes through the through-holes 410 of the fluid passing member 400, which is a diffuser, and then passes through the permeation holes 350 of the fluid permeable anodic oxide film 200. Thereafter, the reaction gas is uniformly diffused and injected toward a glass 620 mounted on the upper surface of a susceptor 630.

Hereinafter, fluid permeable bodies which make use of anodic oxide films according to third to sixth preferred embodiments of the present invention will be described with reference to FIGS. 19 to 28.

As shown in FIGS. 19 to 22, a fluid permeable body which makes use of an anodic oxide film 200 according to a third preferred embodiment of the present invention includes: a main body 400 having through-holes 410 through which a fluid passes; and an anodic oxide film 200 integrally formed with at least one surface of the main body 400, wherein the anodic oxide film 200 has permeation holes 350 communicating with the through-holes 410.

The size and thickness of the main body 400, the through-holes 410, the anodic oxide film 200 or 200', the pores 310 and the permeation holes 350 shown in FIGS. 19 to 28 are shown on an exaggerated scale for the sake of effective description of the technical content.

Figure 28:
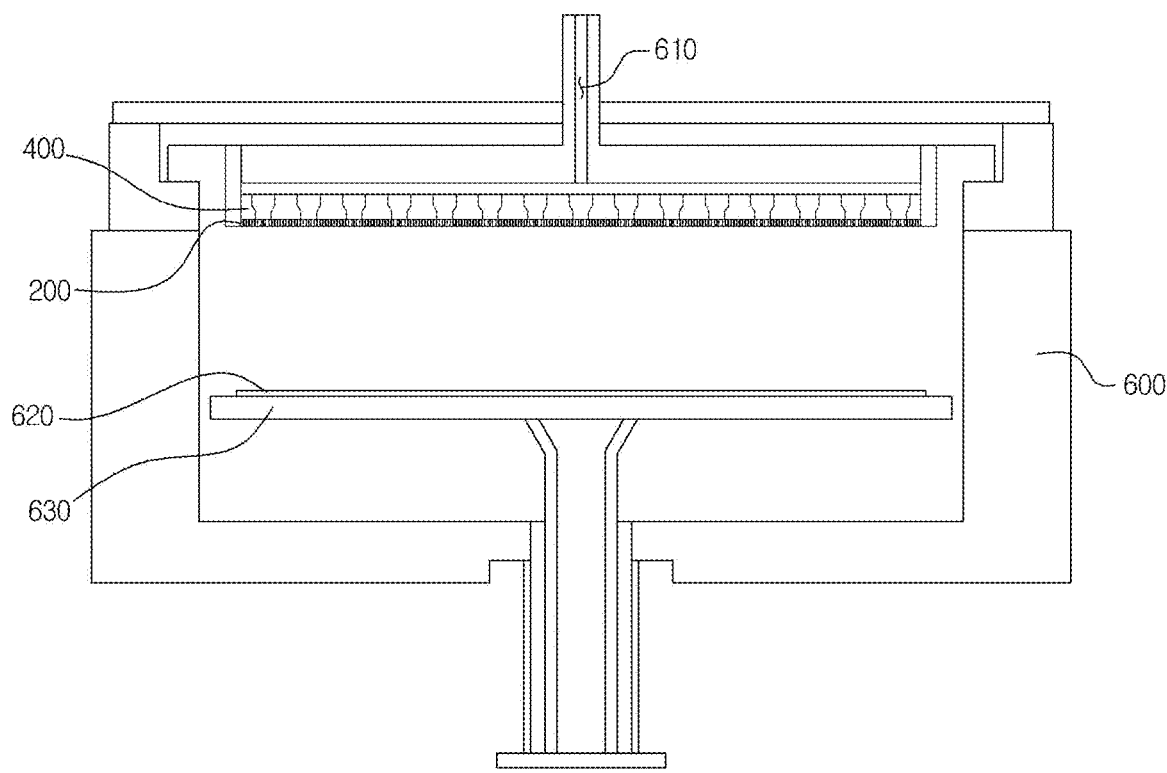
FIG. 28 is a sectional view showing a state in which the fluid permeable body according to the third preferred embodiment of the present invention is installed within a vacuum chamber.

As shown in FIG. 28, the fluid permeable body which makes use of the anodic oxide film 200 may be a diffuser installed within a vacuum chamber 600. The diffuser serves to allow a reaction gas introduced through an introduction part 610 to pass therethrough and to inject the reaction gas toward a glass 620 mounted on the upper surface of a susceptor 630. Since the diffuser installed within the vacuum chamber 600 is well-known in the art including the prior art described earlier, detailed descriptions thereof will be omitted herein.

The fluid permeable body, in which the main body 400 and the anodic oxide film 200 are integrally formed with each other, may be a diffuser installed within a vacuum chamber 600 for manufacturing a liquid crystal display. In this case, the fluid permeable body may preferably have a rectangular parallelepiped shape. In the case of a semiconductor manufacturing apparatus, the diffuser may be formed in a disc shape. Needless to say, the shape of the fluid passing member 400 may be changed depending on the installation environment and condition thereof.

Figure 19:
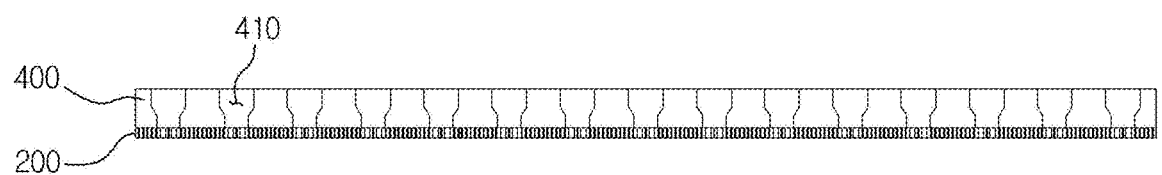
FIG. 19 is a sectional view of a fluid permeable body which makes use of an anodic oxide film according to a third preferred embodiment of the present invention.
Figure 20A:
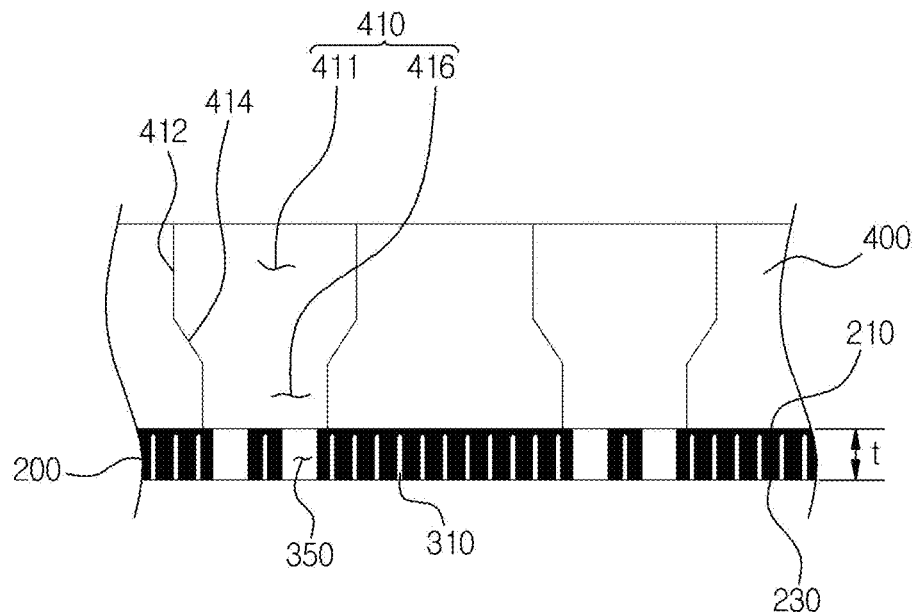
FIG. 20A is a partially-enlarged sectional view of the fluid permeable body shown in FIG. 19.
Figure 20B:
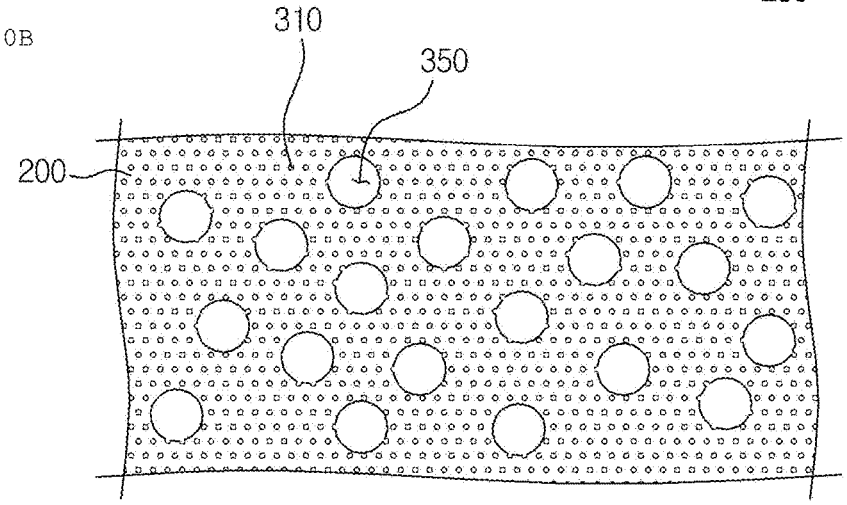
FIG. 20B is a bottom view of the fluid permeable body shown in FIG. 20A.

As shown in FIGS. 19, 20A and 20B, a plurality of through-holes 410 is formed in the main body 400. A fluid can pass through the through-holes 410.

As shown in FIG. 20A, the through-holes 410 are formed so that the inner width of the lower part thereof is smaller than the inner width of the upper part thereof. That is to say, the through-holes 410 are formed so that the inner width of the lower part adjoining the permeation holes 350 is smaller than the inner width of the upper part thereof.

Each of the through-holes 410 includes a first through-hole 411 positioned in the upper portion and a second through-hole 416 having an inner width smaller than an inner width of the first through-hole 411. The permeation holes 350 of the anodic oxide film 200 are positioned below the second through-hole 416.

The first through-hole 411 includes a first part 412 positioned in the upper portion and configured to introduce a reaction gas, and a second part 414 extending downward from the lower end of the first part 412 so that the inner width thereof grows smaller downward. The second through-hole 416 vertically extends downward from the lower end of the second part 414.

A reaction gas introduced into the first part 412 of the first through-hole 411 is injected toward the anodic oxide film 200 after sequentially passing through the second part 414 and the second through-hole 416.

As shown in FIG. 20A, the first part 412 is defined by an inner wall which is formed to extend vertically.

The second part 414 is positioned between the first part 412 and the second through-hole 416 and is defined by an inner wall which is obliquely formed so that the inner width thereof grows smaller downward.

The second through-hole 416 is positioned between the second part 414 and the permeation holes 350 and is defined by an inner wall which is formed to extend vertically. The inner width of the second through-hole 416 is set to become smaller than the inner width of the first part 412. The second through-hole 416 serves to reduce the pressure of the reaction gas and to increase the flow velocity of the reaction gas. The lower end portion of the second through-hole 416 may make contact with the upper surface 210 of the anodic oxide film 200.

The anodic oxide film 200 is disposed on one surface, namely the lower surface, of the main body 400. On one surface, namely the lower surface, of the main body 400 on which the anodic oxide film 200 is disposed, the inner width of the through-holes 410 is larger than the inner width of the permeation holes 350. In other words, the inner width of the lower end portion of the second through-hole 416 is larger than the inner width of the permeation holes 350. A plurality of permeation holes 350 communicates with the second through-hole 416 which is a lower part of each of the through-holes 410.

In this embodiment, the fluid permeable anodic oxide film 200 may preferably have a shape corresponding to the shape of the fluid passing member 400. Furthermore, the outer periphery of the anodic oxide film 200 may be formed at a size substantially equal to the size of the outer periphery of the main body 400.

The anodic oxide film 200 includes: a plurality of regularly-arranged pores 310 formed by anodizing metal; and a plurality of permeation holes 350 having an inner width larger than an inner width of the pores 310 and extending through the anodic oxide film 200. The metal to be anodized to form the anodic oxide film 200 may be the main body 400 described above. In other words, the anodic oxide film 200 may be formed by anodizing the main body 400.

Alternatively, the anodic oxide film 200 may be formed by anodizing a base metal and then removing the base metal. Thereafter, the main body 400 may be vapor-deposited on at least one surface of the anodic oxide film 200, thereby forming the fluid permeable body of the present invention.

Figure 21A:
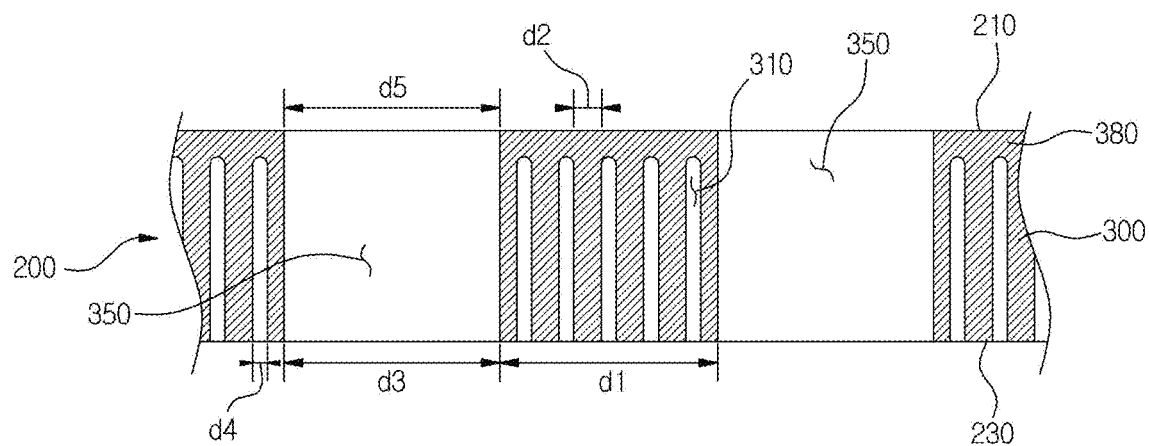
FIGS. 21A and 21B are views showing modifications of the fluid permeable anodic oxide film.

As shown in FIGS. 20A, 20B and 21A, the anodic oxide film 200 may include a porous layer 300 having pores 310 and a barrier layer 380 formed above the porous layer 300 and configured to close one ends of the pores 310.

A plurality of pores 310 extending in an up-down direction is formed in the anodic oxide film 200. The lower end of each of the pores 310 is formed so as to penetrate the lower surface 230 of the anodic oxide film 200, namely the lower surface 230 of the porous layer 300. In addition, the upper end of each of the pores 310 is closed by the barrier layer 380.

Figure 21B:
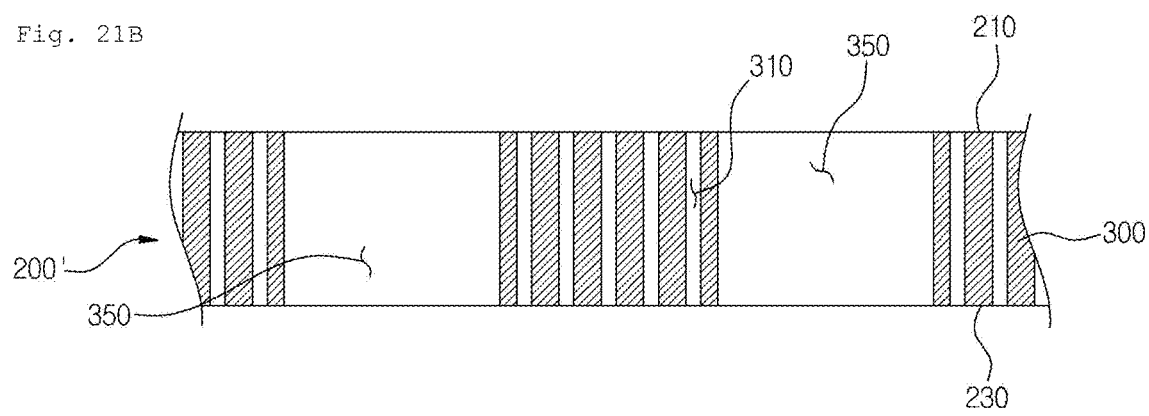

Alternatively, as shown in FIG. 21B, the anodic oxide film 200' may include only a porous layer 300 having pores 310. In other words, after anodizing metal, it may be possible to remove both the metal and the barrier layer 380. As a result, the pores 310 shown in FIG. 21B vertically extend through the anodic oxide film 200'. In other words, the pores 310 are formed so as to penetrate the upper surface 210 and the lower surface 230 of the anodic oxide film 200'.

Hereinafter, descriptions will be made on the basis of the anodic oxide film 200 which is integrally formed on one surface of the main body 400 by anodizing the main body 400.

As shown in FIG. 21A, the pores 310 of the anodic oxide film 200 have an inner width d4 which falls within a range of several nanometers to 300 nanometers.

The metal used as a base material of the anodic oxide film 200 or 200' include aluminum-based metal. That is to say, the metal may preferably be aluminum or aluminum alloy. The anodic oxide film 200 or 200' may preferably be made of aluminum oxide obtained by anodizing aluminum-based metal.

In the meantime, the permeation holes 350 are formed so as to penetrate the upper surface 210 and the lower surface 230 of the anodic oxide film 200 or 200'. The permeation holes 350 shown in FIGS. 20A, 20B and 21A are formed so as to extend through both the porous layer 300 and the barrier layer 380. The permeation holes 350 illustrated in FIG. 21B are formed so as to extend through only the porous layer 300.

The permeation holes 350 are formed in a plural number so as to penetrate the upper surface 210 and the lower surface 230 of the anodic oxide film 200 or 200'.

As shown in FIGS. 20A, 20B, 21A and 21B, the pores 310 are positioned in a gap between the permeation holes 350. In other words, a plurality of pores 310 is positioned between two permeation holes 350. As shown in FIG. 21A, the spaced-apart distance d2 between two adjacent pores 310 is smaller than the spaced-apart distance d1 between two adjacent permeation holes 350 (d1>d2).

As shown in FIGS. 20A, 20B, 21A and 21B, the inner width of the permeation holes 350 is larger than the inner width of the pores 310. As can be noted from the sectional view shown in FIG. 21A, the inner width d3 of the permeation holes 350 is set to become larger than the inner width d4 of the pores 310 (d3>d4).

The permeation holes 350 can be formed by etching the anodic oxide film 200. The permeation holes 350 are formed to vertically extend parallel to the pores 310.

As shown in FIG. 21A, the permeation holes 350 have an inner width remaining constant from one end of the fluid permeable anodic oxide film 200 to the other end of the fluid permeable anodic oxide film 200 (d3=d5). In other words, the inner width of each of the permeation holes 350 remains constant from the upper end to the lower end thereof. The permeation holes 350 have an inner width d3 which falls within a range of 300 nanometers to several millimeters.

In the meantime, as shown in FIG. 20A, the thickness t of the anodic oxide film 200 is set to fall within a range of 0.4 micrometers to 200 micrometers.

The anodic oxide film 200 is made of a translucent material. It is therefore possible to check the amount of an impurity caught in the permeation holes 350.

A plurality of permeation holes 350 may correspond to and communicate with one of the through-holes 410 formed in the fluid passing member 400. In the sectional view of FIG. 20A, two permeation holes 350 are disposed below one of the through-holes 410 within the extent of an inner width of one of the through-holes 410. Alternatively, three or more permeation holes 350 may be disposed within the extent of an inner width of one of the through-holes 410 and may communicate with one of the through-holes 410.

As described above, the anodic oxide film 200 having the permeation holes 350 is integrally formed with the main body 400 having the through-holes 410. This makes it possible to improve the diffusion uniformity of a fluid.

Furthermore, the anodic oxide film 200 formed on one surface of the main body 400 by anodizing the main body 400 is used. Thus, the manufacturing process is simple and easy to perform.

Hereinafter, a method of manufacturing the fluid permeable body according to the third embodiment of the present invention will be described with reference to FIGS. 22A to 22C.

Figure 22A:
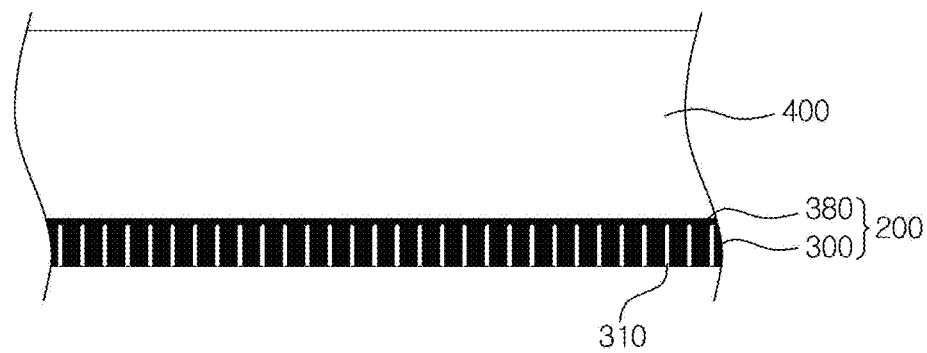
FIGS. 22A to 22C are views showing a manufacturing sequence of a fluid permeable body which makes use of an anodic oxide film according a third preferred embodiment.

First, as shown in FIG. 22A, an anodic oxide film 200 having a plurality of regularly-arrange pores 310 is formed on a lower surface of a metal-made main body 400 by anodizing the main body 400.

Figure 22B:
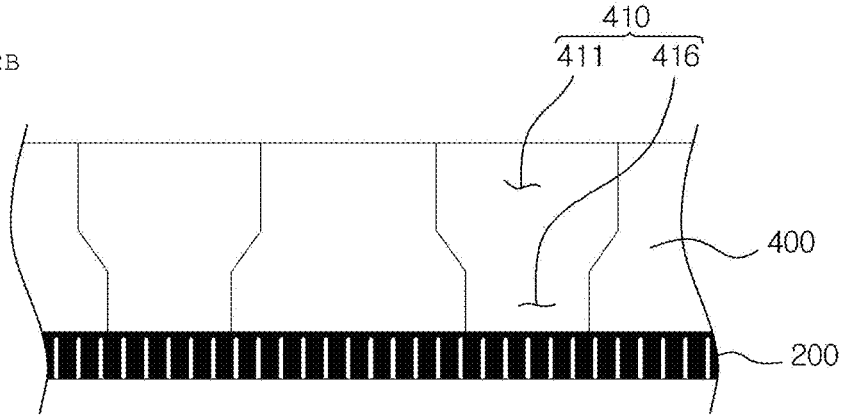

Secondly, as shown in FIG. 22B, through-holes 410 each including a first through-hole 411 and a second through-hole 416 are formed in the main body 400. The first through-hole 411 may be first formed by machining. Thereafter, the second through-hole 416 may be formed by etching.

Figure 22C:
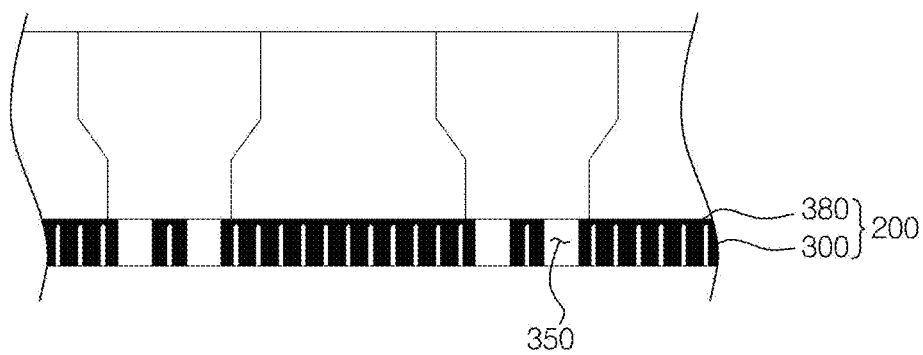

Thirdly, as shown in FIG. 22C, permeation holes 350 are formed so as to extend through the anodic oxide film 200. The permeation holes 350 may be formed through the use of an etching solution after masking the lower surface of the anodic oxide film 200 in a desired pattern.

The anodic oxide film 200 has pliability such that the anodic oxide film 200 can be bent in a fluid flow direction. When the anodic oxide film 200 is formed on the lower surface of the main body 400, if a fluid passes through the through-holes 410 of the main body 400 and flows toward the upper surface 210 of the anodic oxide film 200, the portion of the anodic oxide film 200 not fixed to the main body 400 in a corresponding relationship with the through-hole 410 is bent downward in a convex shape. In other words, the radii of curvature of the upper surface 210 and the lower surface 230 of the portion of the anodic oxide film 200 not fixed to the main body 400 in a corresponding relationship with the lower side of the through-hole 410 are reduced. This provides an effect of enlarging the lower end portions of permeation holes 350 adjoining the lower surface 230 of the anodic oxide film 200, thereby increasing a diffusion range of the fluid passing through the permeation holes 350.

As described above, each of the anodic oxide films 200 and 200' includes the permeation holes 350 having an inner width larger than an inner width of the pores 310. This enables a fluid to pass through the permeation holes 350 without clogging the permeation holes 350 and to be uniformly diffused. Furthermore, unlike a case in which each of the pores 310 is partially enlarged, the inner walls which define the pores 310 are not broken. This makes it possible to maintain the structural strength of the anodic oxide films 200 and 200'. Since the permeation holes 350 are formed by etching, it is easy to manufacture the anodic oxide films 200 and 200'.

Figure 23A:
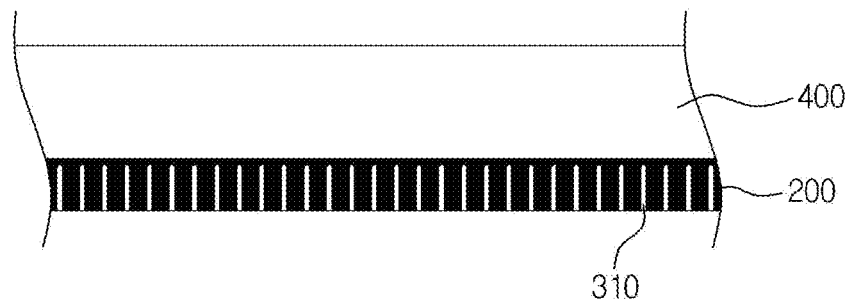
FIGS. 23A to 23C are partially-enlarged sectional views showing a manufacturing sequence of a fluid permeable body which makes use of an anodic oxide film according to a fourth preferred embodiment of the present invention.
Figure 23B:
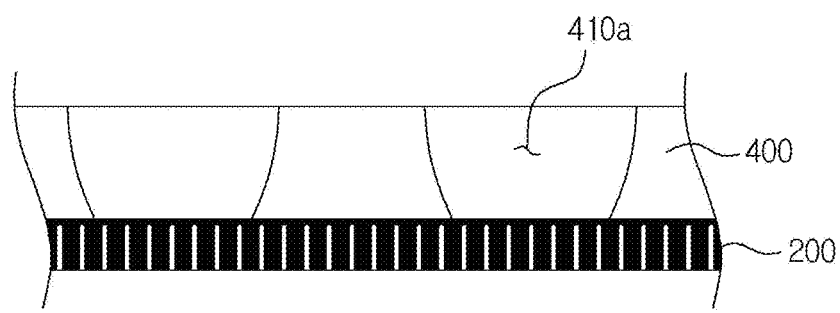
Figure 23C:
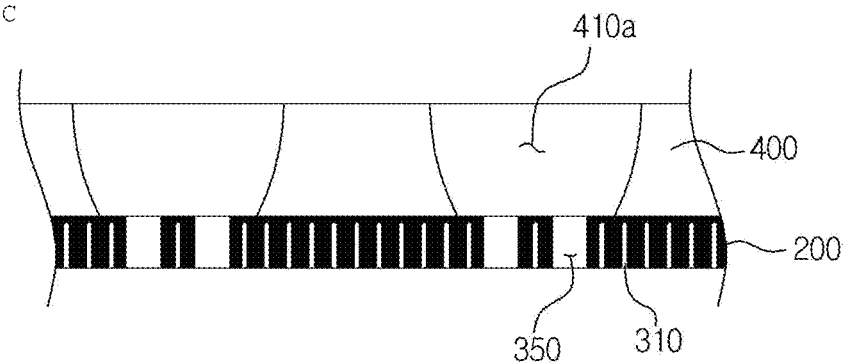

In FIGS. 23A, 23B and 23C, there is shown a method of manufacturing a fluid permeable body according to a fourth embodiment of the present invention. The method according to the fourth embodiment is directed to a case where through-holes 410 can be formed only by etching because the height of the main body 400 is smaller than the height of the main body 400 according to the third embodiment.

First, as shown in FIG. 23A, an anodic oxide film 200 having a plurality of regularly-arrange pores 310 is formed on a lower surface of a main body 400.

Secondly, as shown in FIG. 23B, a plurality of vertically-extending through-holes 410a is formed in the main body 400. In the fourth embodiment, the through-holes 410a can be formed by etching. Each of the through-holes 410a is defined by an inner wall which is obliquely formed so that the inner width thereof grows smaller downward. In other words, the inner width of each of the through-holes 410a grows smaller toward the permeation holes 350.

Thirdly, as shown in FIG. 23C, permeation holes 350 vertically extending through the anodic oxide film 200 are formed in the anodic oxide film 200. The fluid permeable body according to the fourth embodiment shown in FIG. 23C is manufactured through the three steps described above.

Figure 24A:
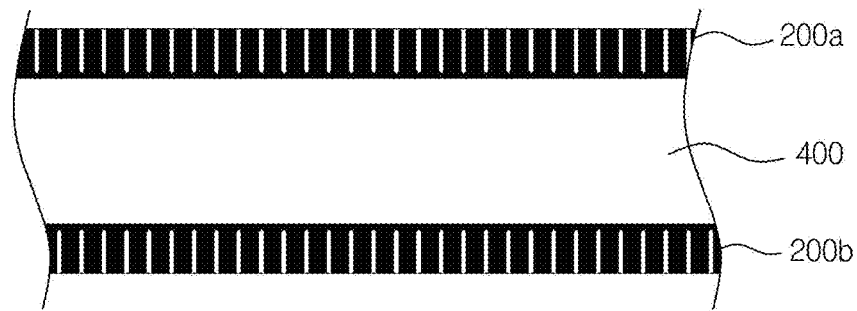
FIGS. 24A to 24C are partially-enlarged sectional views showing a manufacturing sequence of a fluid permeable body which makes use of an anodic oxide film according to a fifth preferred embodiment of the present invention.
Figure 24B:
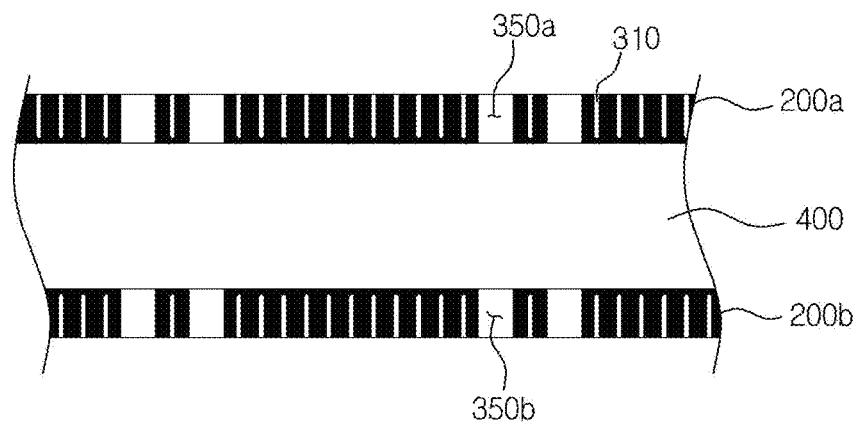
Figure 24C:
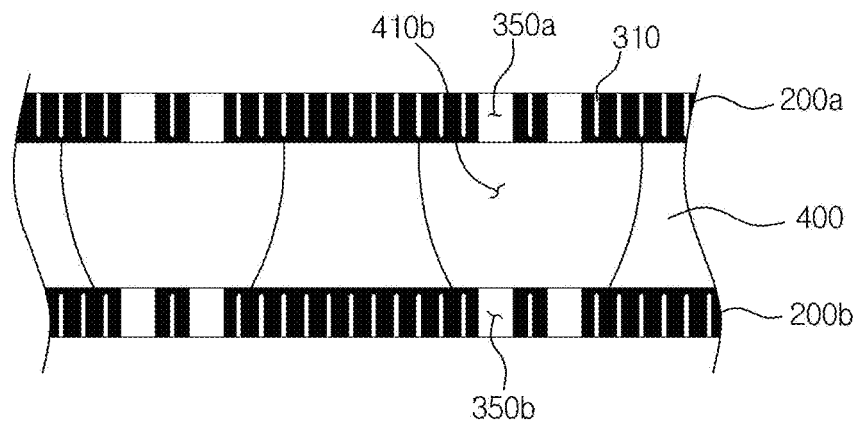

In FIGS. 24A, 24B and 24C, there is shown a method of manufacturing a fluid permeable body according to a fifth embodiment of the present invention. As shown in FIG. 24C, the fluid permeable body according to the fifth embodiment includes a first anodic oxide film 200a, a second anodic oxide film 200b, and a main body 400 positioned between the first anodic oxide film 200a and the second anodic oxide film 200b.

First, as shown in FIG. 24A, a first anodic oxide film 200a having a plurality of regularly-arranged pores 310 and a second anodic oxide film 200b having a plurality of regularly-arranged pores 310 are formed on the opposite surfaces of a metal-made main body 400 by anodizing the main body 400. As shown in FIG. 24A, the first anodic oxide film 200a is formed on the upper surface of the main body 400. The second anodic oxide film 200b is formed on the lower surface of the main body 400.

Secondly, as shown in FIG. 24B, permeation holes 350 are formed so as to vertically extend through the first anodic oxide film 200a and the second anodic oxide film 200b. The permeation holes 350 can be formed by etching. The permeation holes 350 include first permeation holes 350a formed in the first anodic oxide film 200a and second permeation holes 350b formed in the second anodic oxide film 200b.

Thirdly, as shown in FIG. 24C, through-holes 410b are formed in the main body 400. The through-holes 410b are positioned between the first permeation holes 350a and the second permeation holes 350b so as to communicate with the first permeation holes 350a and the second permeation holes 350b.

Each of the through-holes 410b is defined by an inner wall which is obliquely formed so that the inner width thereof grows smaller downward. In other words, the inner width of each of the through-holes 410b grows smaller toward the second anodic oxide film 200b. The through-holes 410b can be formed through an etching process by pouring an etching solution into the first permeation holes 350a.

Figure 25:
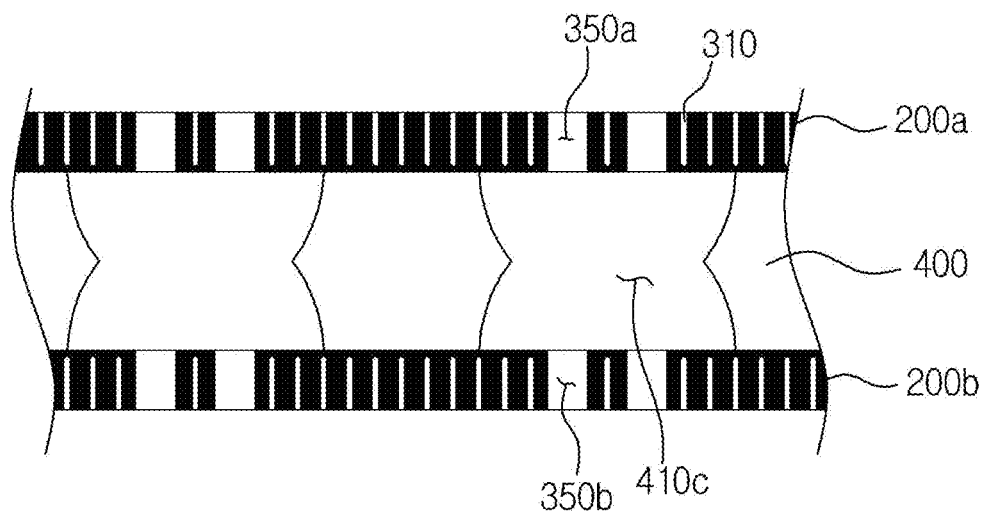
FIGS. 25 and 26 are views showing modifications of the manufacturing sequence shown in FIGS. 24A to 24C.
Figure 26:
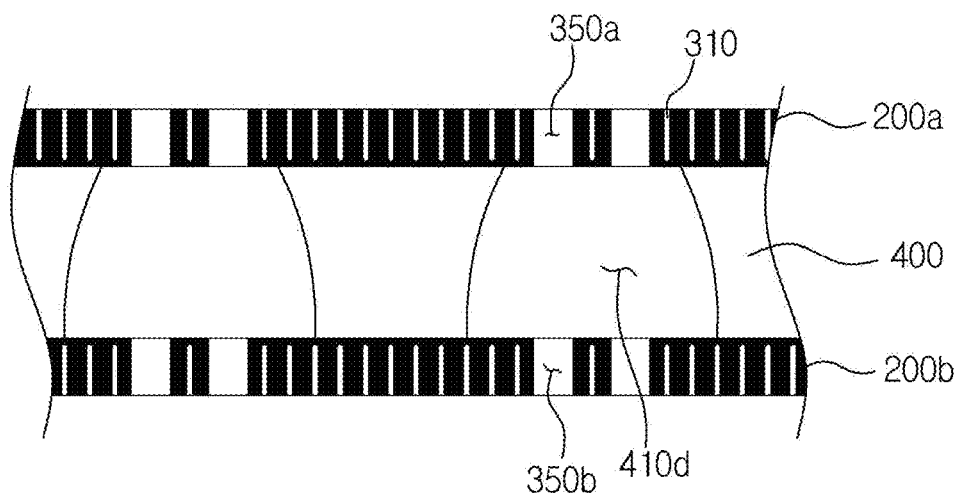

In FIGS. 25 and 26, there are shown through-holes 410c and through-holes 410d as modifications of the through-holes 410b.

Unlike the through-holes 410b shown in FIG. 24C, which have an inner width growing smaller downward, the through-holes 410c shown in FIG. 25 have a diameter (or an inner width) growing smaller toward the inside of the main body 400. In other words, the through-holes 410c have an inner width which grows smaller from the upper part toward the central part and which grows smaller from the lower part toward the central part. The through-holes 410c shown in FIG. 25 are formed through an etching process by pouring an etching solution into the firs permeation holes 350a and the second permeation holes 350b.

The through-holes 410d shown in FIG. 26 have an inner width which grows smaller upward. In other words, the through-holes 410d shown in FIG. 26 have an inner width which grows smaller toward the first anodic oxide film 200a. The through-holes 410d shown in FIG. 26 can be formed through an etching process by pouring an etching solution into the second permeation holes 350b existing under the main body 400.

Figure 27:
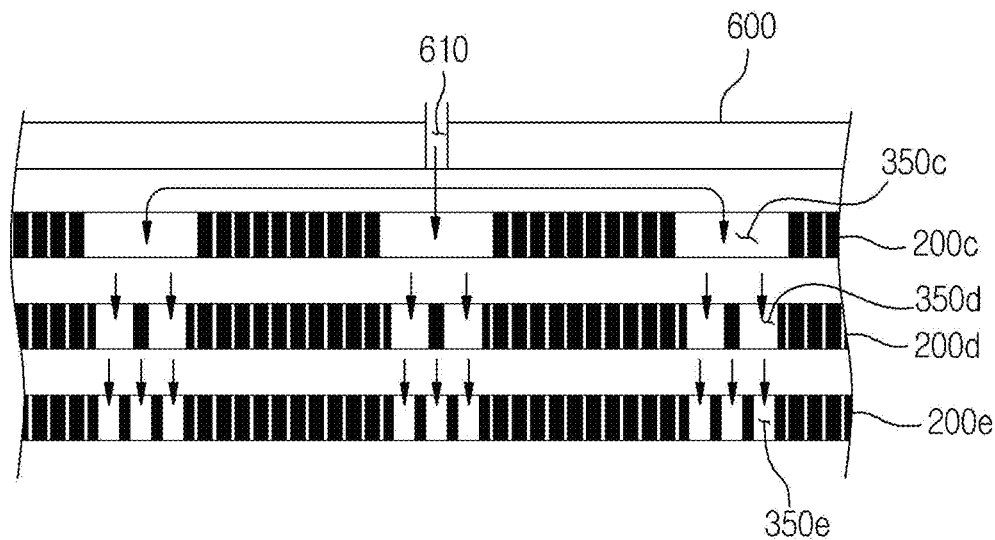
FIG. 27 is a sectional view of a fluid permeable body which makes use of an anodic oxide film according to a sixth preferred embodiment of the present invention.

In FIG. 27, there is shown a fluid permeable body according to a sixth embodiment of the present invention. The fluid permeable body according to the sixth embodiment does not include a main body 400 but includes only a plurality of anodic oxide films 200c, 200d and 200e.

The fluid permeable body according to the sixth embodiment includes a third anodic oxide film 200c having third permeation holes 350c through which a fluid passes, and a fourth anodic oxide film 200d vertically spaced apart from the third anodic oxide film 200c and having fourth permeation holes 350d through which a fluid passes, wherein the third permeation holes 350c and the fourth permeation holes 350d communicate with each other and the fourth permeation holes 350d have an inner width smaller than an inner width of the third permeation holes 350c. The fluid permeable body according to the sixth embodiment further includes a fifth anodic oxide film 200e vertically spaced apart from the fourth anodic oxide film 200d and having fifth permeation holes 350e.

As shown in FIG. 27, the third anodic oxide film 200c, the fourth anodic oxide film 200d and the fifth anodic oxide film 200e are vertically spaced apart from one another. Coupling members (not shown) are disposed between the outer periphery of the third anodic oxide film 200c and the outer periphery of the fourth anodic oxide film 200d and between the outer periphery of the fourth anodic oxide film 200d and the outer periphery of the fifth anodic oxide film 200e in order to keep the third anodic oxide film 200c, the fourth anodic oxide film 200d and the fifth anodic oxide film 200e spaced apart from each other.

Furthermore, as shown in FIG. 27, a plurality of fourth permeation holes 350d and a plurality of fifth permeation holes 350e are formed below one of the third permeation holes 350c in a corresponding relationship with the extent of the inner width of one of the third permeation holes 350c. The fourth permeation holes 350d have an inner width smaller than an inner width of the third permeation holes 350c. The fifth permeation holes 350e have an inner width smaller than an inner width of the fourth permeation holes 350d.

The fluid introduced through the introduction part 610 of the vacuum chamber 600 sequentially passes through the third permeation holes 350c, the fourth permeation holes 350d and the fifth permeation holes 350e. Thus, the inner widths of the third permeation holes 350c, the fourth permeation holes 350d and the fifth permeation holes 350e are set to grow smaller from the third permeation holes 350c toward the fifth permeation holes 350e along a fluid flow direction. Furthermore, the number of the permeation holes 350c, 350d and 350e grows larger along the fluid flow direction. The fluid permeable body according to the sixth embodiment may be a diffuser installed within the vacuum chamber 600.

Referring to FIG. 28, the fluid permeable body described with reference to FIGS. 19 to 27 may be a diffuser installed within a vacuum chamber 600 for manufacturing a liquid crystal display. A reaction gas introduced through an introduction part 610 passes through the through-holes 410 of the main body 400 and the permeation holes 350 of the anodic oxide film 200 of the fluid permeable body serving as a diffuser. Thereafter, the reaction gas is uniformly diffused and injected toward a glass 620 mounted on an upper surface of a susceptor 630.

While preferred embodiments of the present invention have been described above, the present invention is not limited to the aforementioned embodiments. It goes without saying that a person skilled in the relevant art can make various changes and modifications without departing from the spirit and scope of the invention defined in the claims.

What is claimed is:

1. A fluid permeable body, comprising:
a fluid passing member having a plurality of through-holes through which a fluid passes; and
a fluid permeable anodic oxide film coupled to a lower surface of the fluid passing member,
wherein the fluid permeable anodic oxide film includes a plurality of regularly-disposed pores formed by anodizing metal and a plurality of permeation holes having an inner width larger than an inner width of the pores and extending through the fluid permeable anodic oxide film, the through-holes communicating with a plurality of the permeation holes,
wherein the pores and the permeation holes are arranged in the anodic oxide film horizontally displaced from one another,
wherein lower ends of the pores are closed by a barrier layer, and the pores are fluid-impermeable,
wherein the through-holes are divided into a first part, a second part, a third part and a fourth part with respect to a fluid flow direction from the fluid passing member toward the fluid permeable anodic oxide film,
wherein the first part includes an inner wall which is formed to extend vertically,
wherein the second part includes an inner wall which is obliquely formed so that an inner width thereof grows smaller downward,
wherein the third part includes an inner wall which is formed to extend vertically,
wherein the fourth part includes an inner wall which is obliquely formed so that an inner width thereof grows larger downward.

2. The fluid permeable body of claim 1, wherein the fluid passing member includes at least two fluid passing members coupled to one another, and the fluid permeable anodic oxide film is disposed between the two fluid passing members and coupled to a surface of at least one of the two fluid passing members.

3. The fluid permeable body of claim 1, wherein the fluid passing member includes a seating portion having a seating groove formed on an upper surface of the fluid passing member, and the fluid permeable anodic oxide film is seated on the seating portion.

4. The fluid permeable body of claim 1, wherein a first metal portion is formed in an outer periphery portion of the fluid permeable anodic oxide film and is coupled to the fluid passing member.

5. The fluid permeable body of claim 1, wherein the fluid permeable anodic oxide film is formed by anodizing a base metal and then removing the base metal.

6. The fluid permeable body of claim 1, further comprising:
a metal portion formed on an upper surface or a lower surface of the fluid permeable anodic oxide film.

7. The fluid permeable body of claim 1, wherein the fluid passing member is a diffuser installed within a vacuum chamber.

8. A fluid permeable body, comprising:
a main body having a plurality of through-holes through which a fluid passes; and
a fluid permeable anodic oxide film integrally formed with at least one surface of the main body, the fluid permeable anodic oxide film including a plurality of regularly-disposed pores formed by anodizing metal and a plurality of permeation holes having an inner width larger than an inner width of the pores and extending through the fluid permeable anodic oxide film,
wherein an inner width of the through-hole on the at least one surface on which the fluid permeable anodic oxide film is formed is larger than an inner width of the permeation holes, and the permeation holes communicate with a plurality of the through-holes within an extent of the inner width of the through-hole,
wherein the pores and the permeation holes are arranged in the anodic oxide film horizontally displaced from one another,
wherein lower ends of the pores are closed by a barrier layer, and the pores are fluid-impermeable,
wherein the through-holes are divided into a first part, a second part, a third part and a fourth part with respect to a fluid flow direction,
wherein the first part includes an inner wall which is formed to extend vertically,
wherein the second part includes an inner wall which is obliquely formed so that an inner width thereof grows smaller in the direction toward the fluid permeable anodic oxide film,
wherein the third part includes an inner wall which is formed to extend vertically,
wherein the fourth part includes an inner wall which is obliquely formed so that an inner width thereof grows larger in the direction toward the fluid permeable anodic oxide film.

9. The fluid permeable body of claim 8, wherein the fluid permeable anodic oxide film includes a first anodic oxide film and a second anodic oxide film, and the main body is positioned between the first anodic oxide film and the second anodic oxide film.

* * * * *